United States Patent [19]
Leitch

[11] Patent Number: 5,559,506
[45] Date of Patent: Sep. 24, 1996

[54] METHOD AND APPARATUS FOR ENCODING AND DECODING A DIGITAL RADIO SIGNAL

[75] Inventor: Clifford D. Leitch, Coral Springs, Fla.

[73] Assignee: Motorola, Inc., Schaumburg, Ill.

[21] Appl. No.: 238,082

[22] Filed: May 4, 1994

[51] Int. Cl.⁶ .................................................... G06F 12/00
[52] U.S. Cl. ................................. 340/825.44; 371/50.1
[58] Field of Search ....................... 340/825.44, 825.07; 371/49.1, 49.2, 49.4, 50.1, 51.1

[56] References Cited

U.S. PATENT DOCUMENTS

| | | |
|---|---|---|
| 3,200,374 | 8/1965 | Ballard .................................. 371/50.1 |
| 5,063,533 | 11/1991 | Erhart et al. . |
| 5,168,493 | 12/1992 | Nelson et al. . |

FOREIGN PATENT DOCUMENTS

| | | |
|---|---|---|
| 1296498 | 11/1989 | Japan .................................... 371/50.1 |

OTHER PUBLICATIONS

Chase, "A Combined Coding And Modulation Approach For Communications Over Dispersive Channels", IEEE Transactions On Communications, vol. COM–21, No. 3, Mar. 1973, pp. 162–164.

*Primary Examiner*—Michael Horabik
*Attorney, Agent, or Firm*—James A. Lamb; R. Louis Breeden; Philip P. Macnak

[57] ABSTRACT

A selective call receiver (105) for use in a selective call communication system (100) and a controller (206). The receiver (203) is for receiving and demodulating a digital signal which includes a predetermined sequence of A×N interleaved symbols representing a non-interleaved set of N tiers of symbols, each tier having A symbols, wherein A and N are positive integers. The controller (206) includes a deinterleaver (830) which reconstructs the non-interleaved set of N tiers of symbols from the demodulated signal, and a decoder (950) detects and corrects errors in the deinterleaved set of N tiers of symbols. The digital signal is transmitted simultaneously from two transmitters (103) having a difference frequency 1/P, and the symbols are transmitted at a rate of SPS symbols per second. The period of the difference frequency is given by P=(A×N)/SPS.

20 Claims, 17 Drawing Sheets

METHOD AND APPARATUS FOR ENCODING AND DECODING A DIGITAL RADIO SIGNAL

FIELD OF THE INVENTION

This invention relates in general to encoding and decoding a digital signal and in particular to a method for encoding and decoding a digital signal used for communicating information in a selective call radio system.

BACKGROUND OF THE INVENTION

Digital radio communications are subject to errors caused by broadband noise and burst noise phenomena. A known means of improving the receiving sensitivity of a digital signal in the presence of such phenomena, which has been used successfully, is word encoding using block codes, which is effective against random errors as caused by broadband noise, and dispersion coding for protection against random burst errors such as those caused by Rayleigh fading. Two examples of dispersion coding known to one of ordinary skill in the art are convolutional coding and two dimensional interleaving of a block of words. Two dimensional interleaving of a block of words is accomplished by arranging a number of words, wherein the words are typically encoded by a block code, and the symbols of the words are transmitted sequentially, a symbol from each word, until all the symbols of all the words have been transmitted.

In simulcast radio communication systems, radio signals are transmitted simultaneously from more than one transmitter. At a selective call receiver used in a simulcast system, the signal intercepted by the antenna is likely to be comprised of a signal from more than one transmitter. There are overlap areas in such a system, which are geographic areas of the system where the received signal is comprised of two or more signals of substantially similar strength. When carrier frequencies of the transmitters in a simulcast system are precisely controlled to have exactly the same frequencies, standing wave patterns are set up in the overlap areas. The resultant signal in such an overlap area will vary at a rate equivalent to carrier frequency differences between the transmitters, which may be very slow in an accurately and precisely controlled system. This causes a situation where selective call receivers located in these areas will have very poor probability of recovering a signal due to signal cancellation and distortion. For this reason, it is typical in simulcast systems to intentionally offset the carrier frequencies of transmitters having overlapping coverage areas, for example, by 50 Hz, so as to eliminate the very slowly changing standing waves. This results is periodic bursts of errors, at a rate corresponding to the offset frequency, rather than long periods of time when reception is impossible, which allows messages to be received and understood in the areas where otherwise the probability of signal recovery is poor.

The simulcast situation caused by interfering radio waves is an example of a general case of interference where the interfering signals are similar and have known offset frequencies. Geographic reuse of channels, a technique common in cellular telephone service, is another example of the general case.

In simulcast and geographic reuse systems as described above, data signals which are encoded with typical burst and random error protection schemes as described above do not always achieve nearly as much improvement as with random noise and Rayleigh fading environments. A typical forward error correction code will operate satisfactorily only when the received bit error rate (BER) is less than about 2 percent. However, the received BER may be 10 percent or even higher in simulcast overlap areas.

"Soft" decision decoding is often used to improve the performance of forward error correction codes. When signal quality is estimated for each received symbol, the decoder can use this information to determine which of several possible symbols is most likely in error.

The effectiveness of soft decision decoding is dependent on the accuracy of the signal quality estimates. Methods based on received signal strength are not reliable when interference is present due to simulcasting or an independent signal present on the same channel. The received signal strength may be high at the same time that the interference causes destructive distortion of the received signal. Thus, what is needed is a means to improve the protection of digital signals against the very destructive periodic error bursts which occur in simulcasting as well as against errors resulting from random noise and random burst errors.

SUMMARY OF THE INVENTION

An aspect of the present invention is a method for use in a system controller of a selective call radio communication system for encoding information in a digital radio signal having N×Q×R information symbols, wherein Q, R, and N are positive integers. The method comprises the step of arranging the N×Q×R information symbols into N tiers of Q×R information symbols. Each tier of Q×R information symbols includes R rows having Q information symbols in each row, and includes Q columns having R information symbols in each column. The method further comprises the steps of determining S row parity symbols for addition to each of the R rows as a function of the Q information symbols in the row, S being a positive integer; and expanding each tier to Q+S columns by adding to each row the S row parity symbols determined for each row, at a position which is the same in each row. The method also includes the steps of determining T column parity symbols for addition to each of the Q+S columns as a function of the R symbols in each column, T being a positive integer; and expanding each tier to R+T rows by adding to each column the T column parity symbols determined for each column. In addition, the method includes the step of transmitting the N×(Q+S)×(R+T) symbols in an interleaved sequence. The step of transmitting comprises the steps of selecting one of (Q+S) columns and one of (R+T) rows, and transmitting N symbols selected sequentially from the selected one of (Q+S) columns and the selected one of (R+T) rows in each of the N tiers. The step of transmitting further comprises the steps of selecting sequentially each of the remaining (Q+S−1) columns and repeating for each sequentially selected column the transmitting step, and selecting sequentially each of the remaining (R+T−1) rows and repeating for each sequentially selected row the steps of transmitting N symbols and selecting sequentially each of the remaining (Q+S−1) columns. The digital signal is transmitted simultaneously from two transmitters having a difference frequency 1/P. The symbols are transmitted at a transmission rate of SPS symbols per second, and the period of the difference frequency is related to N, Q, S, R, T, and SPS. A second aspect of the present invention is a system controller for use in a selective call radio communication system. The system controller encodes information in a digital radio signal having N×Q×R information symbols, Q, R, and N being positive integers. The system controller comprises an information memory for arranging the N×Q×R information symbols into N tiers of Q×R information symbols. Each tier of Q×R information symbols includes R rows having Q information symbols in each row, and includes Q columns having R information symbols in each column. The system controller further comprises a parity generator, coupled to the information memory, for determining parity symbols from the information symbols, and generating a total quantity of N×(R+T)×(Q+S) symbols for transmission in the digital radio signal. The parity generator comprises a row parity encoder, coupled to the information memory, for determining S row parity symbols for addition to each of the R rows as a function of the Q information symbols in each row, S being a positive integer; and a row parity memory, coupled to the row parity encoder, for expanding each of the N tiers to Q+S columns by adding to each row of each tier the S row parity symbols determined for each row, at a predetermined location which is the same in each row. The parity generator further comprises a column parity encoder, coupled to the information and row parity memories, for determining T column parity symbols for addition to each of the Q+S columns as a function of the R symbols in each column, T being a positive integer; and a column parity memory, coupled to the column parity encoder, for expanding each tier to R+T rows by adding to each column the T column parity symbols determined for each column. The system controller further comprises an address circuit, coupled to the encoder, for sequentially selecting each of the N×(R+T)×(Q+S) symbols, which is in one of (Q+S) columns, one of (R+T) rows, and one of N tiers, by sequentially selecting the (R+T) columns after sequentially selecting the (Q+S) rows after sequentially selecting the N tiers. The system controller also includes a communication interface, coupled to the address circuit, for transmitting the sequentially selected symbols at a transmission rate of SPS symbols per second. SPS, Q, R, S, T, and U are related to a difference frequency of two transmitters of the radio communication system.

A third aspect of the present invention is a selective call radio communication system, which encodes information in a digital radio signal having N×Q×R information symbols. The symbols are transmitted at a symbol transmission rate of SPS symbols per second, Q, R, and N being positive integers. The system comprises a system controller for generating the digital radio signal. The system controller comprises an information memory for arranging the N×Q×R information symbols into N tiers of Q×R information symbols. Each tier of Q×R information symbols includes R rows having Q information symbols in each row, and includes Q columns having R information symbols in each column. The system controller further comprises a parity generator, coupled to the information memory, for determining parity symbols from the information symbols, and generating a total quantity of N×(R+T)×(Q+S) symbols for transmission in the digital radio signal. The system controller also includes an address circuit, coupled to the encoder, for sequentially selecting each of the N×(R+T)×(Q+S) symbols, which is in one of (Q+S) columns, one of (R+T) rows, and one of N tiers, by sequentially selecting the (R+T) columns after sequentially selecting the (Q+S) rows after sequentially selecting the N tiers. In addition, the system controller includes a communication interface, coupled to the address circuit, for transmitting the sequentially selected symbols. The system further comprises two or more transmitters having a difference frequency 1/P, coupled to the communications interface, which simulcast transmit the digital radio signal. The values of Q, R, S, T and N are selected as a function of the difference frequency and the symbol transmission rate, SPS.

A fourth aspect of the present invention is a selective call receiver for use in a selective call communication system. Information is communicated using a digital signal. The selective call receiver comprises a receiver for receiving and demodulating the digital signal which includes a predetermined sequence of A×N interleaved symbols representing a non-interleaved set of N tiers of symbols, each tier having A symbols, wherein A and N are positive integers; and a controller, coupled to the receiver, for deinterleaving and decoding the digital signal. The controller comprises a deinterleaver, coupled to the receiver, for reconstructing the non-interleaved set of N tiers of symbols from the demodulated signal, the deinterleaver comprising a memory, coupled to the receiver, for storing N tiers of A symbols. The controller further comprises a decoder, coupled to the deinterleaver, for detecting and correcting errors in the deinterleaved set of N tiers of symbols stored in the memory. The decoder comprises a symbol corrector, coupled to the memory, for identifying ambiguous and non-ambiguous errors in each tier of symbols by using parity equations, and for correcting symbols having non-ambiguous errors by using parity equations. The symbol corrector also corrects ambiguous errors by selecting from the set of symbols having ambiguous errors a selected set of symbols having a better burst pattern than burst patterns of other sets of symbols selectable from the set of symbols having ambiguous errors.

A fifth aspect of the present invention is a method for use in a selective call receiver for recovering information from a digital radio signal having a predetermined temporal sequence of A×N symbols representing a non-interleaved set of N tiers of symbols, each tier having A symbols arranged and in rows and columns, A and N being positive integers. Any set of N temporally adjacent symbols in the predetermined temporal sequence of A×N symbols consists of symbols of different tiers. The method comprises the steps of receiving and demodulating the digital radio signal, to generate the predetermined temporal sequence of symbols; and identifying the tier, row, and column in which each symbol is included. The method further comprises the steps of storing A symbols of one of the N tiers into a memory, each stored symbol being associated with the tier, row, and column identified therewith; and decoding errors in the one tier of the N tiers. Each of the steps of deinterleaving, storing, and selecting and decoding is performed for the N tiers of symbols. The step of decoding comprises the steps of identifying ambiguous and non-ambiguous errors in each tier of A symbols by using parity equations, and correcting symbols having non-ambiguous errors by using parity equations. The step of decoding further comprises correcting ambiguous errors by selecting from the set of symbols having ambiguous errors a selected set of symbols having a better burst pattern than burst patterns of other sets of symbols selectable from the set of symbols having ambiguous errors.

DETAILED DESCRIPTION OF THE INVENTION

Figure 1:
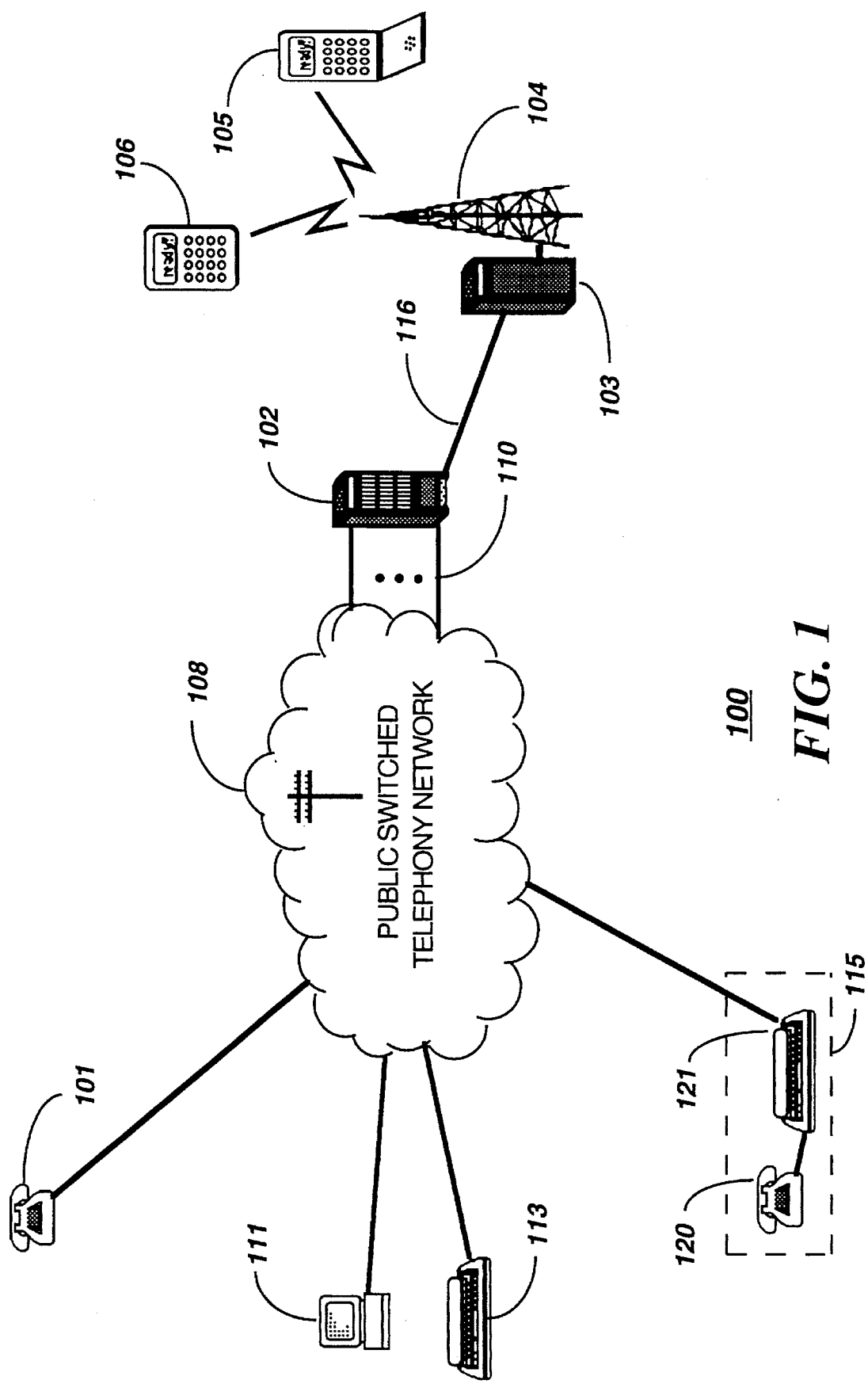
FIG. 1 is an electrical block diagram of a messaging system including a selective call radio communication system, in accordance with the preferred embodiment of the present invention.

Referring to FIG. 1, an electrical block diagram of a selective call communication system 100 is shown in accordance with the preferred embodiment of the present invention. The selective call communication system 100 comprises messaging terminal devices, such as a telephone 101, a computer 111, a desktop personal messaging unit 113 (such as a desktop page entry terminal), and a telephone/desktop messaging unit combination messaging terminal 115, coupled by a conventional public switched telephone network (PSTN) 108 to a system controller 102 through a plurality of telephone links 110. The phone links 110 may be a plurality of twisted wire pairs, or a multiplexed trunk line. The system controller 102 is coupled to and oversees the operation of radio frequency transmitter/receivers 103 (only one of which is shown), through one or more communication links 116, which typically are twisted pair telephone wires, and additionally can include RF, microwave, or other high quality audio communication links. Transmitter/receivers 103, which are message store and forward stations, encode and decode inbound and outbound telephone addresses into formats that are compatible with land line message switch computers and personal radio telephone addressing requirements, such as cellular message protocols. The system controller 102 can also function to encode and decode paging messages which are transmitted or received by the radio frequency transmitter/receiver 103. Telephony signals are typically transmitted to and received from the system controller 102 by telephone sets such as the telephone 101, the telephone handset 120 of the messaging terminal 115, or a personal radio telephone 105. The desktop messaging unit 121 can interrupt the transmission path between the telephone 120 and the desktop messaging unit 121 of the messaging terminal 115 when data messages are being transmitted between the desktop messaging unit 121 and the PSTN 108. Telephony signals and data messages are transmitted from and received by at least one antenna 104 coupled to each of the radio frequency transmitter/receivers 103. The telephony signals are transmitted to and received from the personal radio telephone 105. The radio frequency transmitter/receivers 103 may also be used to transmit data or voice paging messages coupled from the system controller 102 to a portable receiving device 106 or the personal radio telephone 105, which have a keyboard and display. Data messages, and acknowledgments to data messages, may also be received by the transmitter/receivers 103 from the portable receiving device 106 or the personal radio telephone 105, and are coupled to the system controller 102.

It will be appreciated that other selective call radio terminal devices (not shown in FIG. 1), such as mobile cellular telephones, mobile radio data terminals, mobile cellular telephones having attached data terminals, or mobile radios (conventional and trunked) having data terminals attached, are also able to be used in the selective call radio communication system 100. In the following description, the term "selective call receiver" will be used to refer to the personal radio telephone 105, or the portable receiving device 106, a mobile cellular telephone, a mobile radio data terminal, a mobile cellular telephone having an attached data terminal, or a mobile radio (conventional or trunked) having a data terminal attached. Each of the selective call receivers assigned for use in the selective call communication system 100 has an address assigned thereto which is unique within the selective call radio communication system 100. The address enables the transmission of a message from the system controller 102 only to the addressed selective call receiver, and identifies messages and responses received at the system controller 102 from the selective call receiver. Furthermore, each of one or more of the selective call receivers also has a unique telephone number assigned thereto, the telephone number being unique within the PSTN 108. A list of the assigned addresses and correlated telephone numbers for the selective call receivers is stored in the system controller 102 in the form of a subscriber data base.

It should be noted that the system controller 102 is capable of operating in a distributed transmission control environment that allows mixing cellular, simulcast, master/slave, or other coverage schemes involving a plurality of radio frequency transmitter/receivers 103, antennas 104 for providing reliable radio signals within a geographic area as large as a nationwide network. Moreover, as one of ordinary skill in the art would recognize, the telephonic and selective call radio communication system functions may reside in separate system controllers 102 which operate either independently or in a networked fashion.

Figure 2:
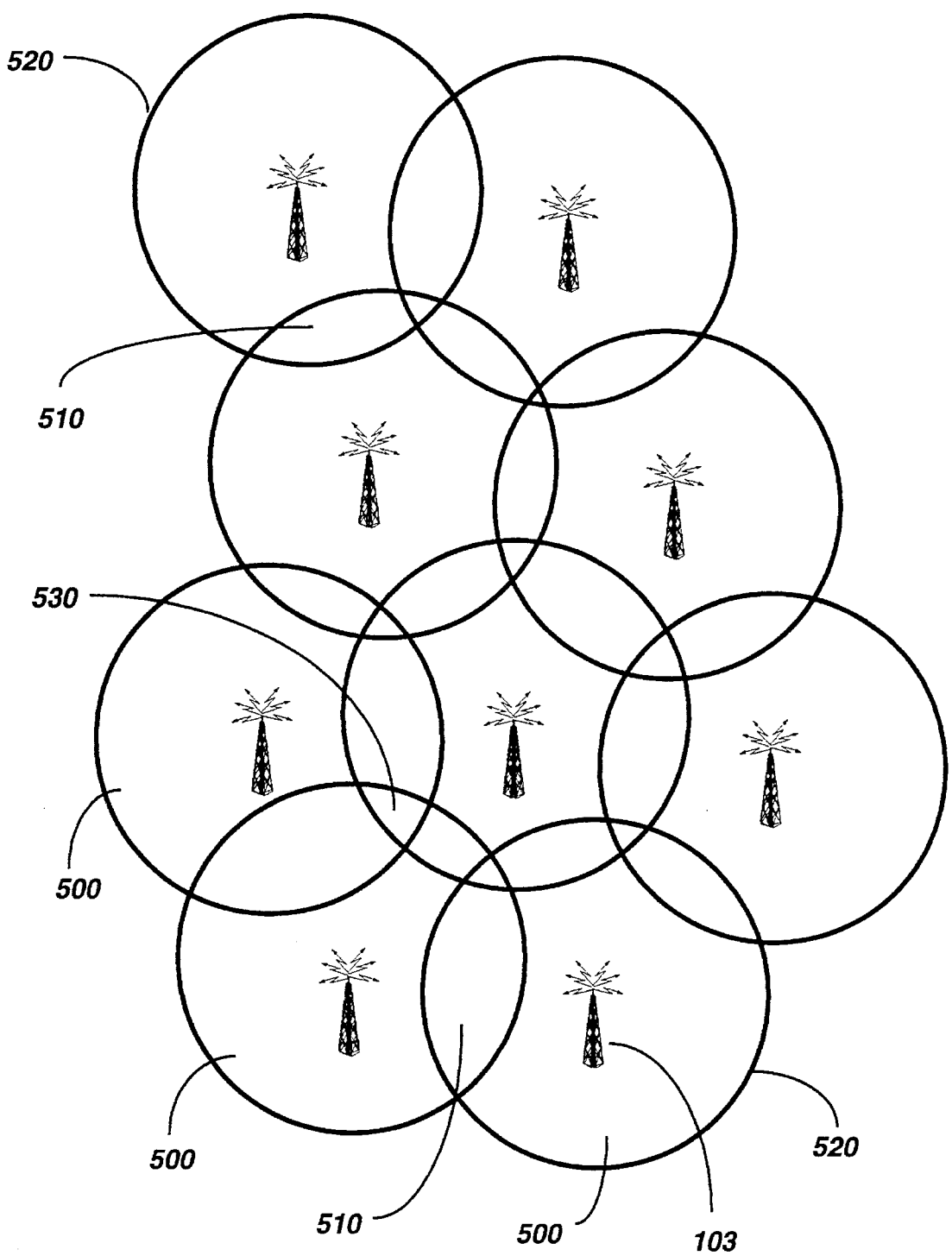
FIG. 2 is a pictorial diagram depicting communications cells of the selective call radio communication system of FIG. 1, in accordance with the preferred embodiment of the present invention.

FIG. 2 is a pictorial diagram depicting communications cells 500 of the selective call radio communication system 100 in accordance with the preferred embodiment of the present invention. The approximate coverage periphery of each communication cells 500 is represented by a circular boundary 520. In each communication cell 500, one transmitter/receiver 103 is shown by way of example. Coverage overlap regions 510 and 530 are regions of the communication system 100 wherein radio signals are typically received by the selective call receiver simultaneously from transmitter/receivers 103 located in different communication cells 500. These overlap regions 510 and 530 are regions where the capture effect, well known in the art of FM radio communications, does not occur reliably from any one of the transmitter/receivers 103, because the signals are often of similar strength. It will be appreciated that when simulcast transmission is used, the radio signals in the overlap region are modulated with identical data symbols, and the timing of transmissions is adjusted so that the data symbols received in an overlap region 510 and 530 are substantially simultaneous to within a small part of one information symbol.

In the coverage overlap regions 510 and 530 of overlapping cells, the two (or more) received signals may combine such that destructive signal interference of the radio carriers occurs, resulting in distortion of the modulated data symbols. The degree of distortion depends strongly on the relative carrier phases of the received signals. When two signals are received with the same carrier phase the distortion is very slight. However, when the carrier phases are close to 180 degrees out of phase the distortion is large.

If the carrier frequencies of all transmitters were exactly synchronized, there would exist a standing wave pattern in coverage overlap regions 510 and 530 such that some regions, where the received carrier phases were close to 180 degrees out of phase, would received continuous poor service due to signal distortion.

In most selective call radio communication systems, the carrier frequencies are intentionally offset as previously described to avoid a standing wave pattern. When there is a slight difference in carrier frequency of two transmitters the carrier phase differences are continually changing at a rate of 360 degrees in each period of the difference of the carrier frequencies. The result is a burst of errors that occurs periodically at a rate equal to the carrier frequency difference rather than a stationary standing wave pattern.

A high speed selective call radio communication system will have a significant number of occurrences of simulcast distortion where as much as 15 to 20% of the received data is obliterated in periodic bursts of errors. These errors cannot be eliminated by simply increasing signal strength.

It will be appreciated that three or more differing carrier frequencies will typically be used throughout the selective call communication system 100, providing a multiplicity of different offset frequencies in overlaps 530 where three transmitter/receivers 103 are involved. For example, a second frequency may be controlled to be 50 hertz greater than a first frequency, and a third frequency may be controlled to be 50 hertz less than the first. The difference of the second and third will then be 100 hertz.

It will be appreciated that the use of circles as the cell coverage periphery is a simplification of the actual coverage peripheries found in typical systems, and which does not substantially affect the conclusions of this system description.

Figure 3:
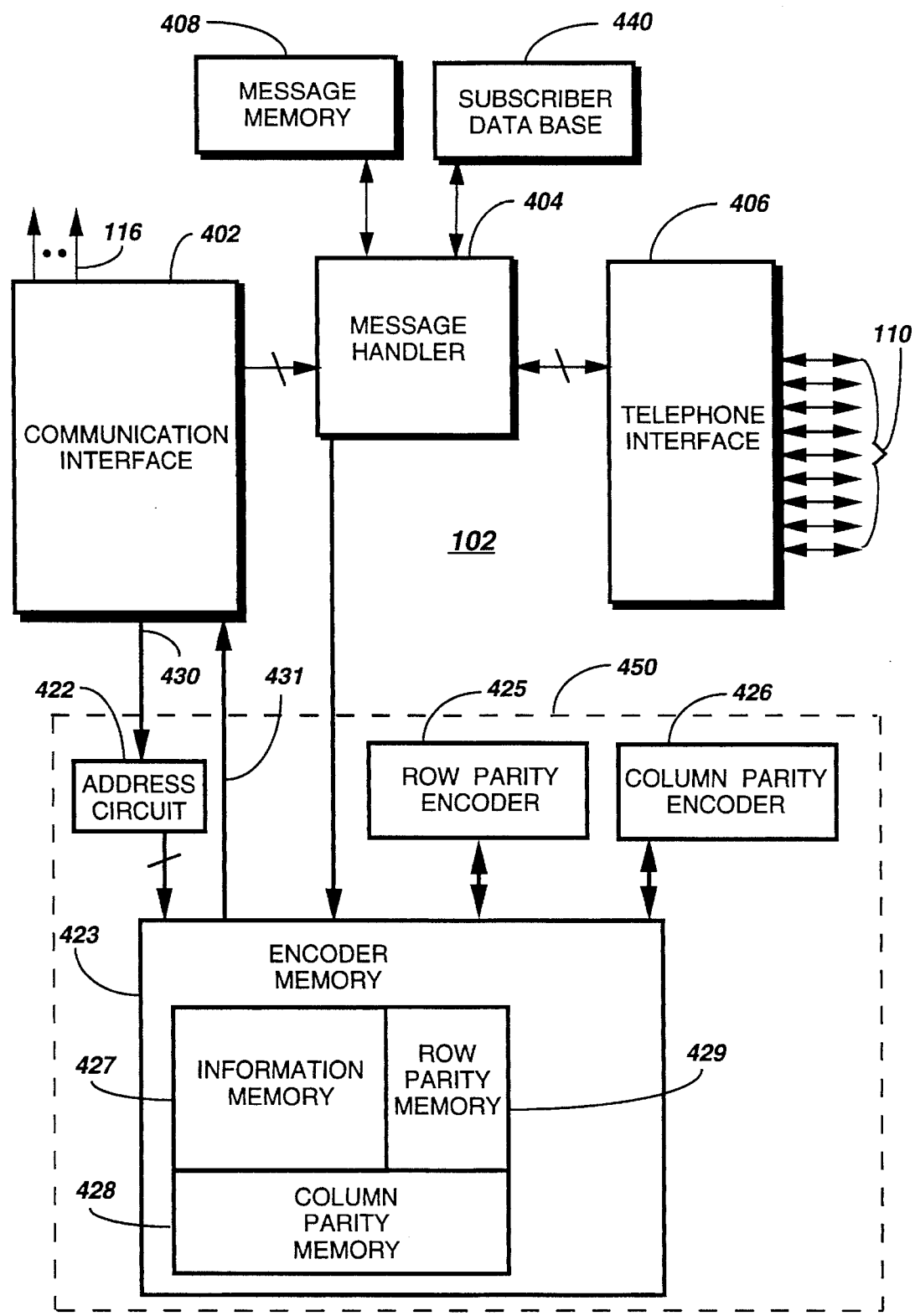
FIG. 3 is an electrical block diagram of a system controller suitable for use in the selective call radio communication system of FIG. 1, in accordance with the preferred embodiment of the present invention.

Referring to FIG. 3, an electrical block diagram of the system controller 102 is shown, in accordance with the preferred embodiment of the present invention. The system controller 102 comprises a communication interface 402, a message handler 404, a message memory 408, a subscriber data base 440, a telephone interface 406, and an encoder 450. The communication interface 402 queues data and stored voice messages for transmission to the selective call receivers, connects telephone calls for transmission to the selective call receivers, and receives acknowledgments, data responses, data messages, and telephone calls from the selective call receivers. The communication interface 402 is coupled to the radio frequency transmitter/receiver 103 (FIG. 1) by the links 116. The message handler 404, which routes and processes messages, is coupled to the communication interface 402 and is further coupled to the telephone interface 406, the subscriber data base 440, the message memory 408, and the encoder 450. The telephone interface 406 handles the switched telephone network 108 (STN) (FIG. 1) physical connection, connecting and disconnecting telephone calls at the telephone links 110, and routing the audio signals between the phone links and the message handler 404. The subscriber data base 440 stores information for each subscriber, including a correlation between the unique address assigned to each selective call receiver and the telephone number used within the PSTN 108 to route messages and telephone calls to each selective call receiver, as well as other subscriber determined preferences, such as hours during which messages are to be held back from delivery to the selective call unit. The message memory 408 stores messages and responses in queue for scheduled delivery to messaging terminals and selective call receivers.

The encoder 450 comprises an encoder memory 423, a row parity encoder 425, a column parity encoder 426, and an address circuit 422, and is coupled to the message handler, for encoding messages intended for transmission to a selective call receiver. The encoded messages are coupled to the communication interface 402 for transmission of the message using a digital radio signal 431 to the selective call receiver, in response to a transmit clock 430 coupled from the communication interface 402. The transmit clock is coupled to the address circuit 422, outputs of which are coupled to the encoder memory 423 for generating a temporal sequence of interleaved data symbols comprising the digital radio signal 431. The encoder memory 423 comprises an information memory 427, a row parity memory 429, and a column parity memory 428.

The system controller 102 is preferably a model E09PED0552 PageBridge® paging terminal manufactured by Motorola, Inc., of Schaumburg Ill., modified with special firmware elements in accordance with the preferred embodiments of the present invention, as described herein. The communication interface 402, the message handler 404, the message memory 408, the subscriber data base 440, the encoder 450, and the telephone interface 406 are preferably implemented within portions of the model E09PED0552 PageBridge® paging terminal which include, but are not limited to those portions providing program memory, a central processing unit, input/output peripherals, and a random access memory. The system controller alternatively could be implemented using a MPS2000® paging terminal manufactured by Motorola, Incorporated of Schaumburg, Ill. The subscriber data base 440 and message memory 408 may alternatively be implemented as magnetic or optical disk memory, which may alternatively be external to the system controller 102.

Figure 4:
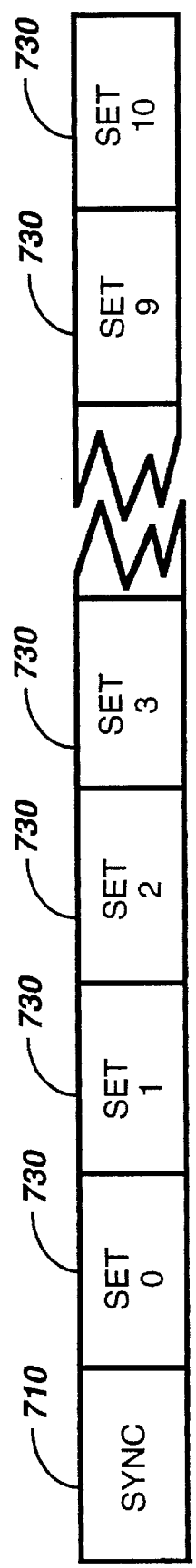
FIG. 4 and FIG. 5 are organization diagrams of an interleaved digital signal which includes encoded information and parity symbols, for use in the selective call radio communication system of FIG. 1, in accordance with the preferred embodiment of the present invention.
Figure 5:
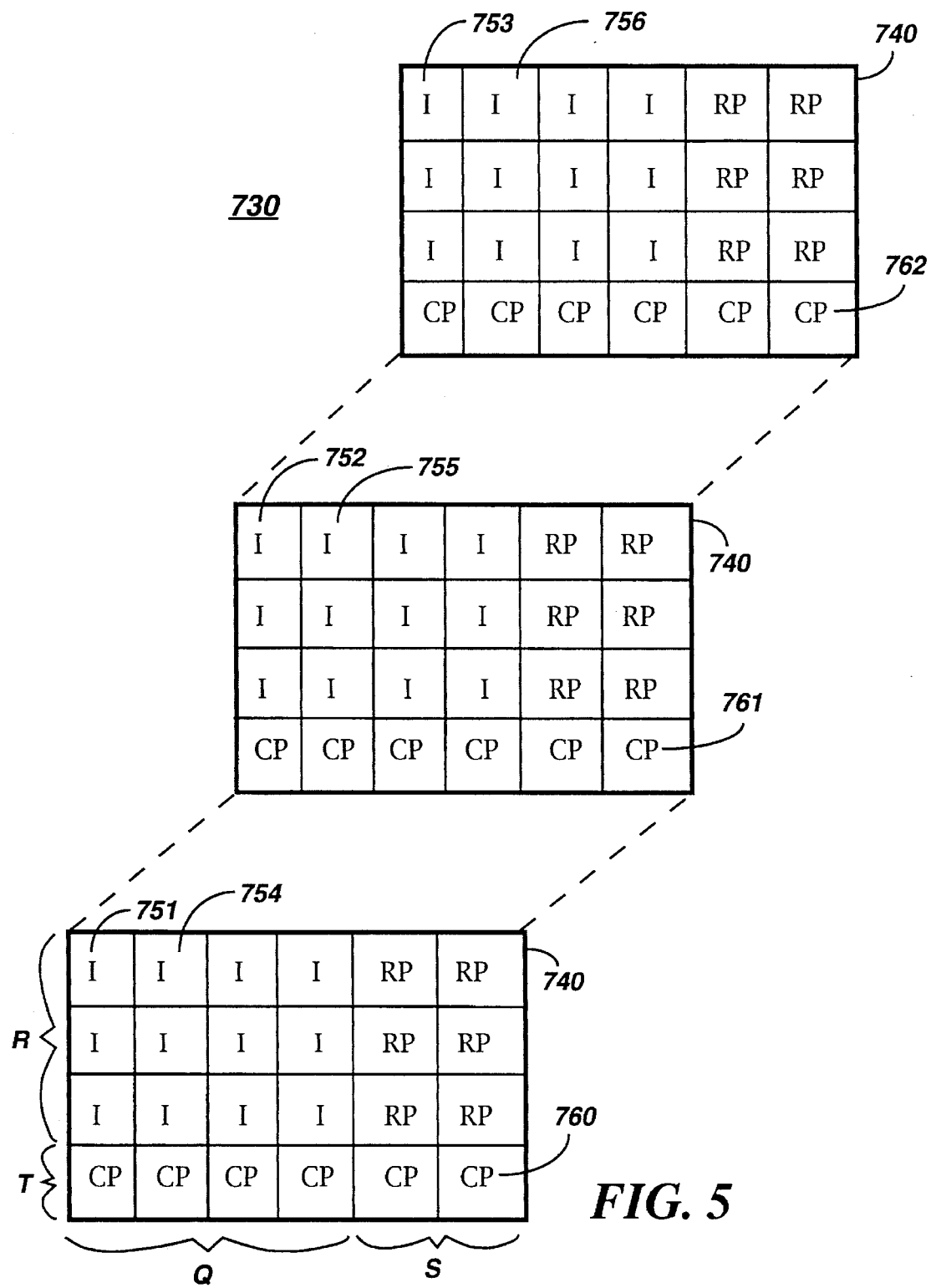

Referring to FIG. 4 and FIG. 5, organization diagrams of an interleaved digital signal, including encoded information and parity symbols, for use in the selective call radio communication system 100 of FIG. 1 and FIG. 2, are shown, in accordance with the preferred embodiment of the present invention. The digital signal shown in a time sequence form in FIG. 4 comprises a synchronization portion 710 which includes symbol patterns which facilitate timing synchronization of a selective call receiver to the digital signal transmitted by the transmitter/receivers 103. A plurality of sets of data symbols 730 are encoded, sequential sets of information symbols, of which ten are shown. FIG. 5 shows a three dimensional arrangement of a portion of the data symbols in the digital signal shown in FIG. 4, which are sequentially encoded by the encoder 450 of FIG. 3 for radio transmission.

The symbol set 730 contains N×Q×R information symbols, wherein N, Q and R are predetermined positive integers. The N×Q×R information symbols are arranged by the encoder 450 (FIG. 3) into the information memory 427 (FIG. 3), in N tiers 740, each tier having R rows by Q columns of information symbols. The arrangement of the information symbols within the rows, columns and tiers is immaterial. Each tier is expanded to Q+S columns by the row parity encoder 425 (FIG. 3) by adding S parity symbols to each row, wherein S is a predetermined positive integer. The additional S×R row parity symbols are stored in the row parity memory 429 (FIG. 3). Each tier is further expanded to R+T rows by the column parity encoder 426 (FIG. 3) by adding T column parity symbols for each column, wherein T is a predetermined positive integer. The additional T×(Q+S) row parity symbols are stored in the column parity memory 428 (FIG. 3).

The arrangement is illustrated in FIG. 5 with Q=4, S=2, R=3, T=1 and N=3, however, other values of Q, S, R, T, and N may be used. The information symbols are identified in FIG. 5 as "I". The arrangement is further illustrated with row parity symbols, identified as "RP" in FIG. 5, placed to the right of the rows and column parity symbols, identified as "CP" in FIG. 5, placed below the columns, however, other arrangements may be used.

The information symbols in the N tiers are interleaved within each of the symbol sets 730 for sequential transmission. Preferably, the order of transmission of symbols is symbol 751 first, continuing through the tiers with symbols 752 and 753. A first symbol in the same row and a new column in the same tier as the first symbol, symbol 754, is then transmitted, followed by symbols 755 and 756. Transmission continues in the same manner through the columns of the tiers until the first row of symbols in each tier is transmitted, followed by the symbols of the second, and following rows, and finishing with symbols 760, 761 and lastly, symbol 762.

Figure 6:
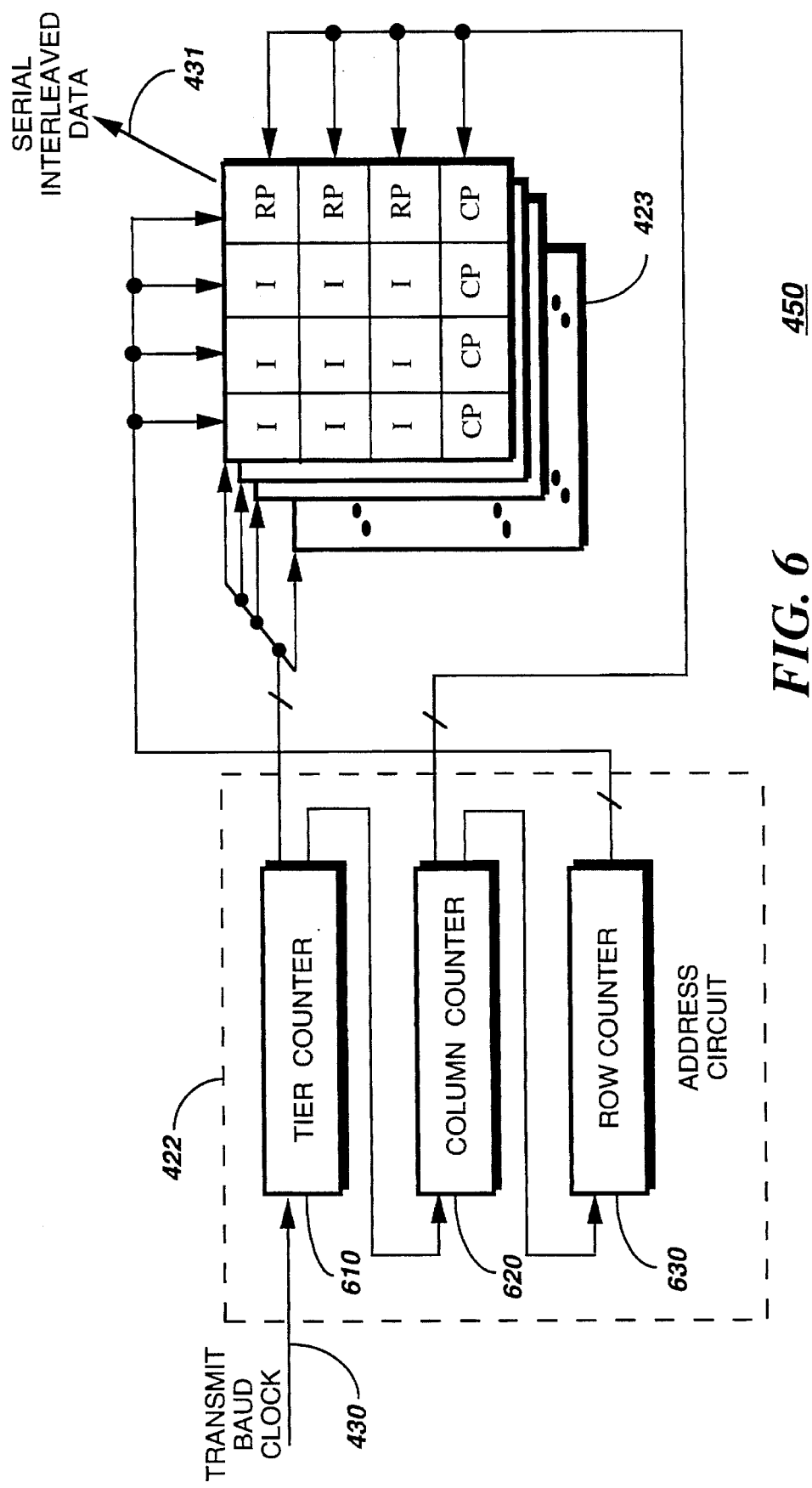
FIG. 6 is an electrical block diagram of a portion of an encoder suitable for use in the system controller of FIG. 3, in accordance with the preferred embodiment of the present invention.

Referring to FIG. 6, an electrical block diagram of a portion of the encoder 450 for accomplishing the interleaving described above is shown, in accordance with the preferred embodiment of the present invention. The transmit clock 430 is coupled to a tier counter 610 which is a divide by N counter for generating a tier address. The tier counter 610 is coupled to the encoder memory 423 and to a column counter 620 which is a divide by (Q+S) counter. The column counter 620 is coupled to the encoder memory 423 and to a row counter 630 which is a divide by (R+S) counter. The row counter is coupled to the encoder memory. The transmit clocking of the serially coupled tier, column, and row counters 610, 620, and 630 generates addresses coupled to the encoder memory which recall the encoded data symbols in the interleaved manner described above. The recalled symbols comprises a temporal sequence of interleaved symbols 431 which are coupled to the communication interface 402 for transmission to the selective call receivers. Other orders for the sequence of transmission of symbols from the rows and columns would be equally valid provided the transmission order takes one symbol from each tier before taking any symbol twice from the same tier. Alternative means, such a set of program instructions for a processor included in the controller 102, could accomplish the sequential interleaving of the data symbols equally well.

Figure 7:
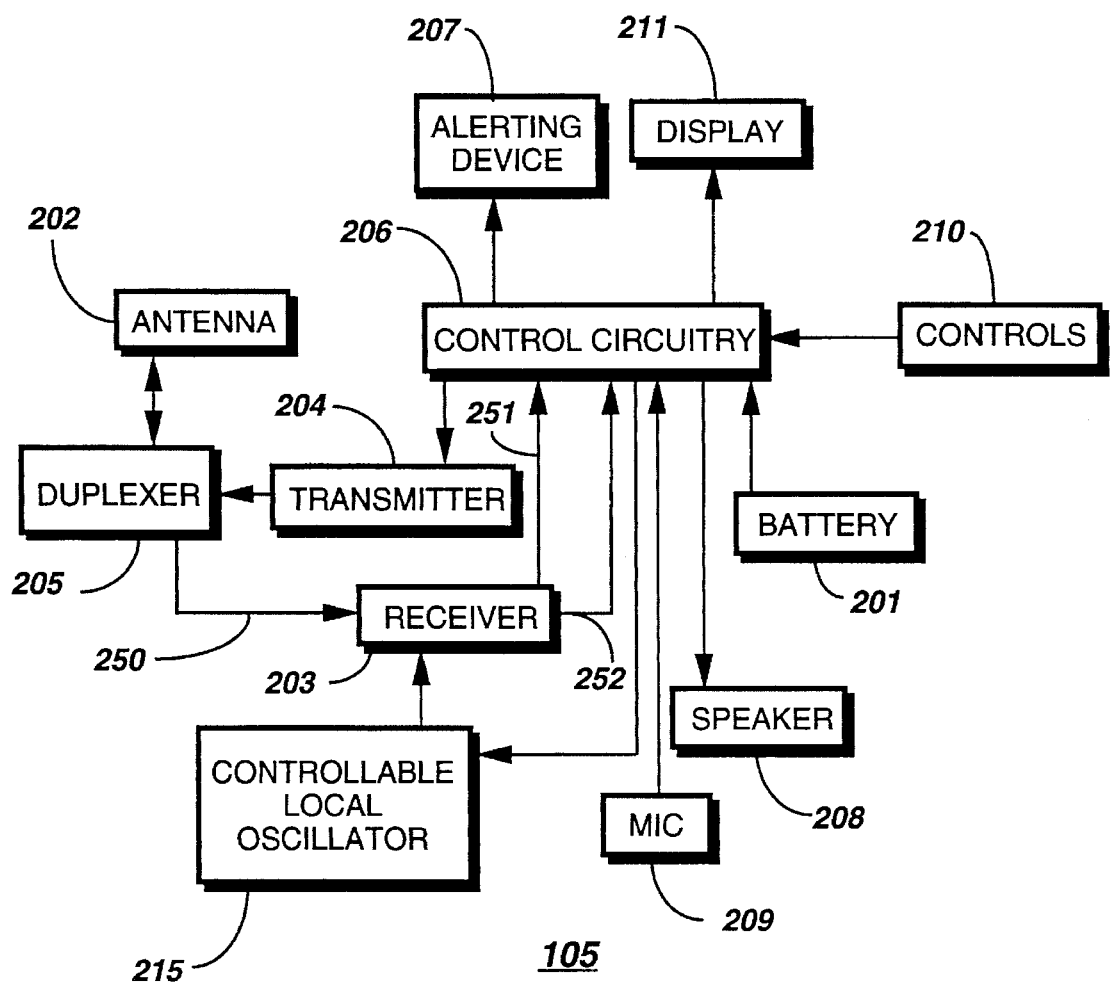
FIG. 7 is an electrical block diagram of a portable receiving device, for use in the radio communication system of FIG. 1, in accordance with a preferred embodiment of the present invention.

Referring to FIG. 7, an electrical block diagram is shown of the personal radio telephone 105 powered by a battery 201, in accordance with the preferred embodiment of the present invention. A digital radio frequency (RF) signal having a carrier frequency is received and transmitted by an antenna 202. The antenna is coupled to a receiver 203 and a transmitter 204 by a duplexer 205. A received signal 250 is filtered, the frequency of the signal is converted, a received signal strength indicator signal (RSSI) 252 is generated, and the received signal 250 is demodulated by the receiver 203. The demodulated signal 251 and RSSI 252 are coupled from the receiver 203 to a control circuit 206 comprising control logic for filtering the demodulated signal 251 and recovering information contained within the received signal 250. The control circuit 206 also comprises a frequency correction means (not shown) which is coupled to a controllable local oscillator 215 for controlling a reference frequency used to generate a local oscillator signal which is coupled to the receiver 203. The local oscillator signal is used by the receiver 203 for the frequency conversion of the received signal 250. A portion of the recovered information is used by the control circuit 206 to activate an alert 207 device (a ringer in the case of a cellular radio telephone), and after answering the call, to sustain a telephone connection. When the demodulated signal 251 includes data information, the control circuit 206 presents the information on a display 211, such as a liquid crystal display. When the telephone connection is completed, the user audibly communicates with another party via a speaker 208 and a microphone 209. The control circuit 206 routes recovered audio to the speaker 208 which converts electrical energy into acoustical energy thus enabling the user to hear any communications. The microphone 209 is used to convert acoustic energy into electrical energy for use by the control circuit 206 in modulating the radio frequency carrier produced by the transmitter 204. The user initiates a call by activating a proper control from a set of controls 210 and entering a number of a party to be contacted. When entering and sending a number, the number may be presented on the display 211 to provide the user with visual feedback confirming the number entered and subsequently sent.

Figure 8:
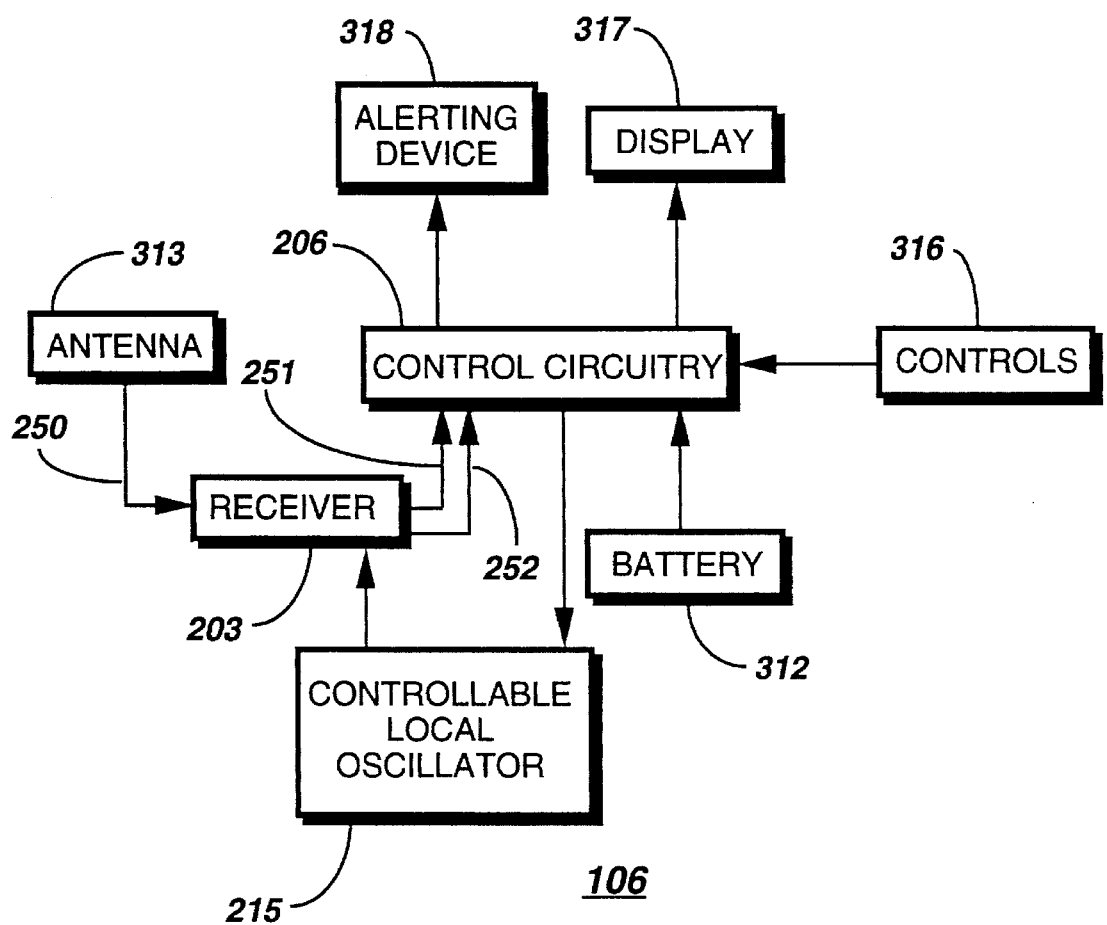
FIG. 8 is an electrical block diagram of a personal radio telephone, for use in the selective call radio communication system of FIG. 1, in accordance with a preferred embodiment of the present invention.

Referring to FIG. 8, an electrical block diagram is shown of the portable receiving device 106 powered by a battery 312, in accordance with the preferred embodiment of the present invention. The portable receiving device 106 operates to receive a radio signal 250 via an antenna 313. The receiver 303 operates to filter, convert, and demodulate the received signal 250 using conventional techniques. Further, the receiver measures the signal strength of the received signal 250 and generates a received signal strength indication signal (RSSI) 252. The receiver couples the RSSI 252 and a demodulated signal 251 to a control circuit 206, comprising control logic for decoding and recovering paging messages contained within the signal, in a manner well known in the art. The control circuit 206 also comprises a frequency correction means (not shown) which is coupled to a controllable local oscillator 215 for controlling a reference frequency used to generate a local oscillator signal which is coupled to the receiver 203. The local oscillator signal is used by the receiver 203 for the frequency conversion of the received signal 250. As determined by the contents of the recovered paging message and the settings of user controls 316, the portable receiving device 106 may present at least a portion of the paging message, using a display 317, such as a liquid crystal display, and may also signal the user via a sensible alerting device 318 that a message has been received. The paging message can include such as numeric and alphanumeric data messages.

In both the personal radio telephone 105 and the portable receiving device 106, it will be appreciated that the control circuit 206 preferably comprises a microprocessor such as one of the 68HC05 family manufactured by Motorola, Inc. of Schaumburg, Ill., and may also comprise application specific integrated circuits which implement functions such as a signal processor (e.g., a filter and decoder), a conventional signal multiplexer, and a voltage regulator that may supply a regulated voltage to other portions of the radio. The display 317 or 211 is preferably an LCD display of a type well known to those skilled in the art. Alternatively, the associated control circuit 206 may include circuits such as digital logic, analog to digital converters, digital to analog converters, programmable input-output ports, a control bus, audio power amplifier circuitry, control interface circuitry, a clock or local oscillator frequency synthesizer, and display illumination circuitry. These elements are typically conventionally assembled to provide the well known features offered in the personal radio telephone 105 or portable receiving device 106 desired by customers.

Figure 9:
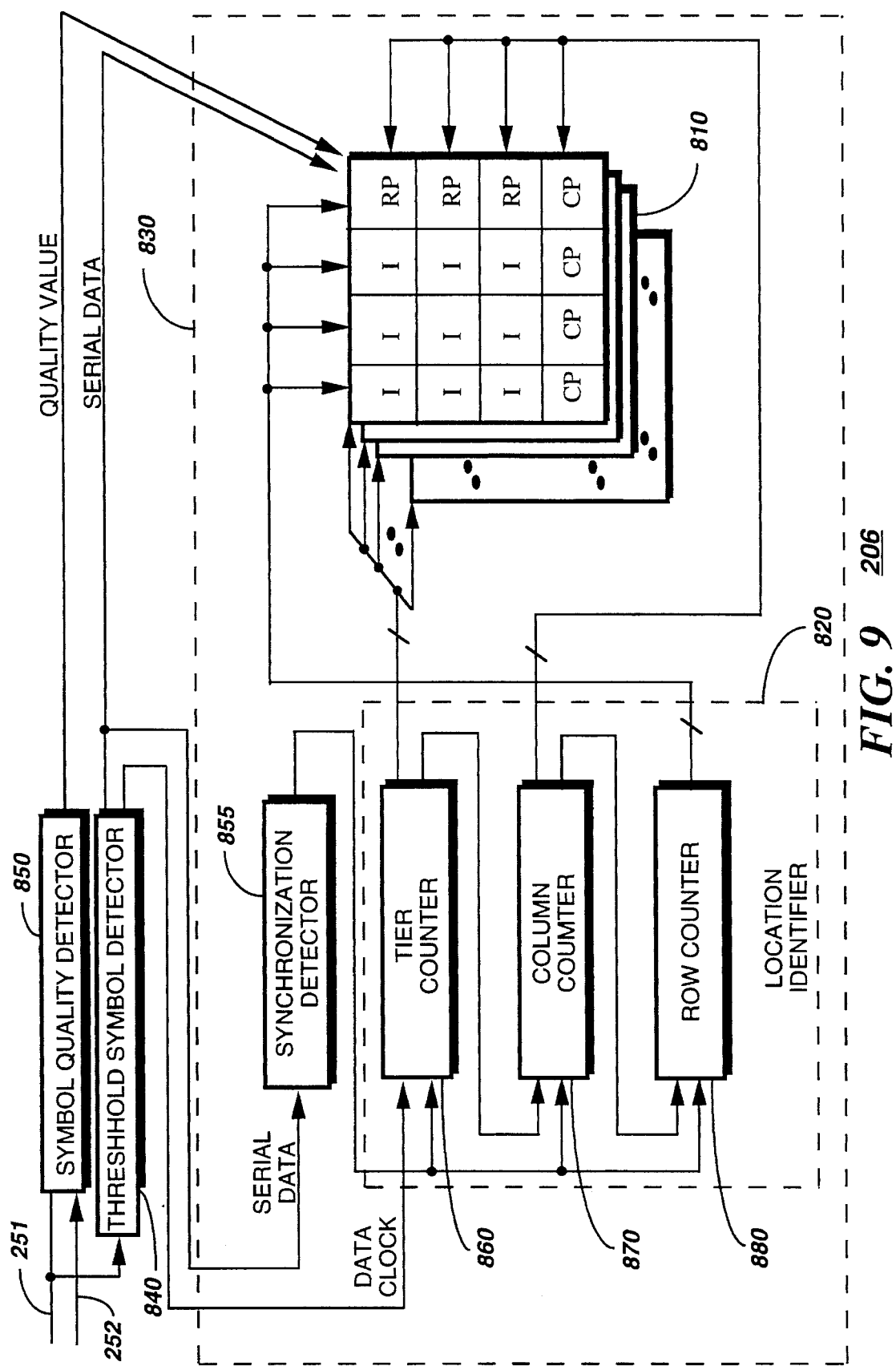
FIG. 9 is an electrical block diagram of a portion of a control circuit suitable for use in the portable receiving device of FIG. 6 and the personal radio telephone FIG. 7.

Referring to FIG. 9, an electrical block diagram is shown of a portion of the control circuit 206 suitable for use in the selective call receiver of FIG. 7 and FIG. 8. The control circuit 206 comprises a threshold symbol detector 840, a symbol quality detector 850, and a deinterleaver 830. The deinterleaver 830 comprises a synchronization detector 855, a location identifier 820, and a memory 810. The demodulated signal 251 is coupled from the receiver 203 to the threshold symbol detector 840 which generates a serial data signal comprising data symbols and a data clock signal. The demodulated signal 251 and the received signal strength indicator signal (RSSI) 252 (FIG. 7 and FIG. 8) are coupled from the receiver 203 to the symbol quality detector 850, which generates a quality value signal associated with each of the data symbols in the digital signal. The quality value signal is coupled to the memory 810. The serial data signal is coupled to the synchronization detector 855 and to the memory 810. The synchronization detector 855 is coupled to the location identifier 820, which in the preferred embodiment comprises three counters 860, 870, and 880 connected in series. The synchronization detector 855 operates in a manner well known to one of ordinary skill in the art to synchronize the location identifier 820 to the serial data signal coupled from the threshold symbol detector 840. The location identifier operates substantially the same as the address circuit 422 of FIG. 6, with a tier counter 860, a column counter 870, and a row counter 880 performing the same functions as described above with respect to the encoder 450 of the system controller 102. The data clock signal is also coupled to the location identifier 820. The output of the location identifier 820, which comprises address signals, is coupled to the memory 810. The received data symbols are deinterleaved by the location identifier 820 and stored in the memory 810, restoring the tiered arrangement of data symbols, as described above with respect to FIG. 5. That is, the first received data symbol in each set is stored in a memory location corresponding to the first column, first row of the first tier. The first received data symbol of the second tier is stored in a memory location corresponding to the first column, first row of the second tier, and so on.

The symbol quality detector 850 is used to compute a quality value associated with each received data symbol, as will be described more fully below. The quality values are also stored in the memory 810, in association with the received data symbols, by the control circuit 206. The quality value is used by the decoder to make a determination as to which data symbols in a group of data symbols identified as having one or more symbol errors is the data symbol most likely to be in error, by identifying the data symbol having the lowest associated quality value.

Figure 10:
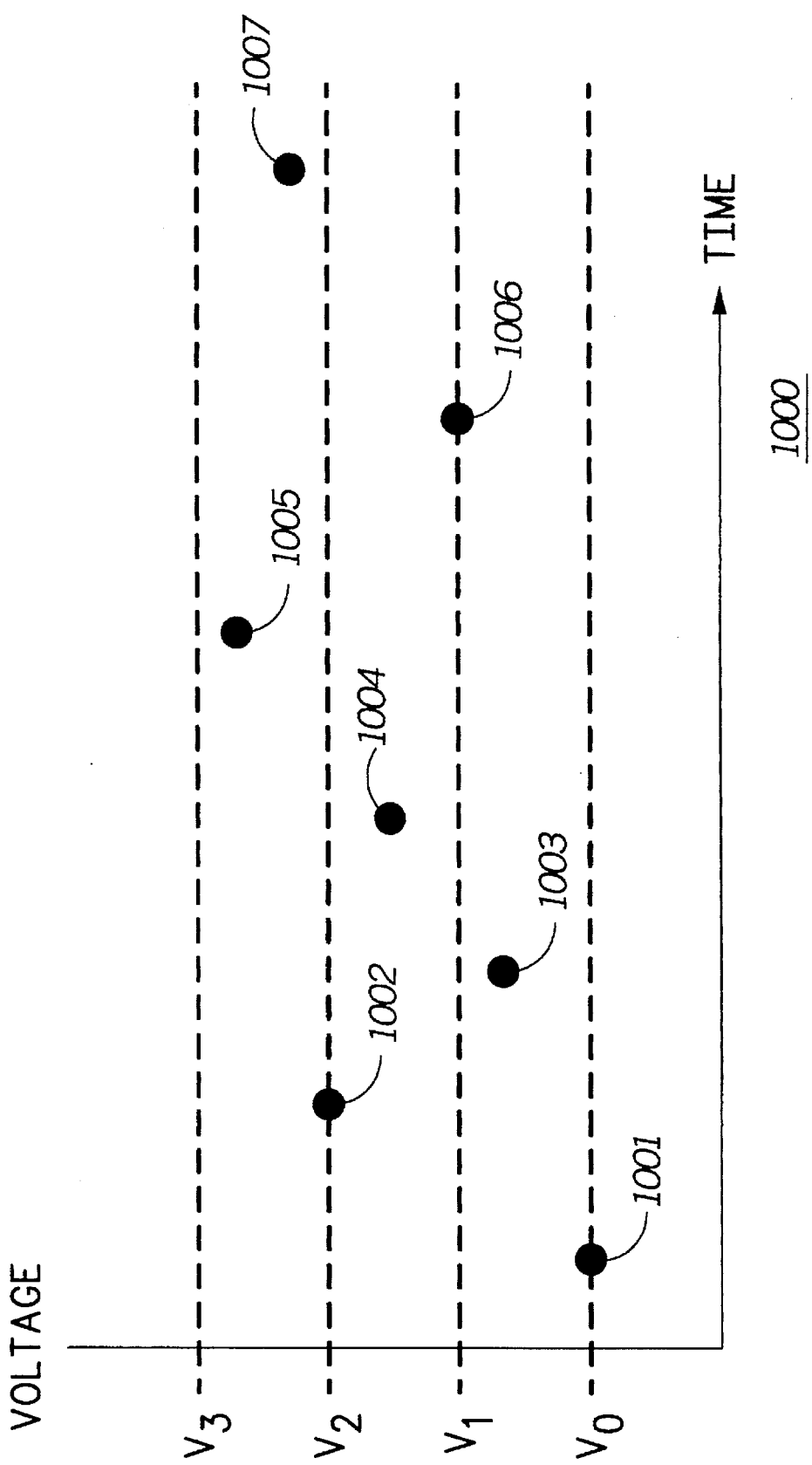
FIG. 10 shows a graph illustrating the voltages of several demodulated data symbols versus time, in accordance with the preferred embodiment of the present invention.

Referring to FIG. 10, the assignment of quality values is more fully described by use of a graph 1000 which illustrates the demodulated voltages of several demodulated data symbols 1001, 1002, 1003, 1004, 1005, 1006, and 1007 versus time, in accordance with the preferred embodiment of the present invention. Four level data symbols are illustrated, but the discussion applies as well to binary (2 level), or other multilevel data symbols. Nominal received voltages, $V_0$, $V_1$, $V_2$ and $V_3$, corresponding to the 4 possible symbols, are predetermined by the designs of the transmitter/receiver 103 and selective call receivers. Under ideal reception conditions, the voltage of each received data symbol will be equal to one of the 4 nominal values, depending on which of the 4 possible data symbols was transmitted.

The threshold symbol detector 840 of FIG. 10 makes a decision as to which data symbol was transmitted, based on the closest nominal voltage level. For example, the threshold symbol detector 840 of FIG. 10 will decide symbol 1003 is the data symbol corresponding to voltage $V_1$ because it is closest to that voltage.

Under ideal reception conditions, the demodulated data symbol voltages will be very close to their nominal voltages. However, when noise or signal distortion (such as the distortion due to simulcasting) is present in the received radio signal 250 (FIG. 7 and FIG. 8), the demodulated data symbol voltages will have the noise or distortion component added to them and may deviate from their nominal voltages. The amount of deviation is used by the symbol quality detector 850 to compute the quality value. The highest quality value, associated with the best demodulated symbols, is assigned when the data symbol voltage corresponds exactly to one of the nominal voltages. Thus, demodulated data symbols 1001 and 1002 would be assigned high quality values because they are nearly equal to their respective nominal voltages, indicating a lack of noise or signal distortion. Data symbol 1004 would be assigned the lowest, or worst, quality value because it is midway between voltages $V_2$ and $V_3$, and thus the decision made by threshold symbol detector 840 is likely in error. Data symbols 1003 and 1005 would be assigned intermediate quality values because they are closer to one particular nominal voltage than any other of the nominal voltages.

The signal distortion can be so severe that the demodulated data symbol voltage can be shifted all the way to or near to an adjacent nominal voltage level. When this happens, the data symbol will be assigned a high quality value even though the decision made by the threshold symbol detector 840 will be incorrect.

In the preferred embodiment of the present invention, cross-coupling of quality values is used to improve the reliability of the quality values, particularly in burst error conditions. Cross-coupling means that the quality value associated with a data symbol is further determined by the quality values associated with symbols which are in temporal proximity to the data symbol, as transmitted in the interleaved sequence, as well as the quality value associated with the data symbol itself. For example, the quality value assigned to a data symbol could be one-half the initial quality value computed for that data symbol alone plus one-quarter of the each of the initial quality values computed for each of the adjacent data symbols alone. Thus, for the example given, the cross-coupled quality value of symbol 1004, designated by CCQV(1004) is given by:

$$CCQV(1004) = 0.25 \times QV(1003) + 0.5 \times QV(1004) + 0.25 \times QV(1005)$$

where QV(1004) is the quality value of the symbol 1004 without cross coupling, and QV(1003) and QV(1005) are the quality values of the symbols transmitted temporally adjacent to (before and after) symbol 1004, without cross-coupling.

Without cross-coupling, data symbol 1006 in FIG. 10 would be assigned a high quality value because its voltage is close to nominal voltage $V_1$. However, adjacent data symbols 1005 and 1007 have low quality values indicating a burst of errors. Thus, in this example of cross-coupling, the quality value of symbol 1006 will be lowered because symbol 1006 is in the midst of a burst of errors and may have been shifted to near $V_1$ from either $V_0$ or $V_2$. Cross-coupling the quality values of adjacent data symbols thus improves the reliability of the quality values.

The cross-coupling of quality values can just as well be between data symbols in adjacent signal spaces as well as between symbols at adjacent times. For example, in quadrature amplitude modulation (QAM), two independent data symbols are transmitted simultaneously; one on an in-phase (I) channel and one on a quadrature (Q) channel. In the case of QAM, the cross-coupling can be between each pair of simultaneously received symbols: the one on the I channel and the one on the Q channel.

Prior art symbol quality detectors have used received signal strength as a basis for estimating signal quality. In these prior art symbol quality detectors, the quality value associated with each data symbol is determined by a radio frequency (RF) signal strength indicator (RSSI) measured during the reception of each data symbol. This method is effective for identifying weak RF signals but not for identifying data symbol distortion induced by RF signal distortion caused by RF signal interference (e.g., from an RF transmitter on a different frequency) or RF signal distortions found in the overlap area of a simulcast system. These types of RF signal distortion occur even when signal strength is high. Thus, undistorted data symbols are not necessarily indicated by high rf signal levels. However, sufficiently weak RF signal levels do indicate probable data symbol distortion.

It will be appreciated then, that the method of this invention is further refined by using the received radio signal strength indication (RSSI) in the symbol quality detector 850 (FIG. 9) to modify the quality value associated with each data symbol by reducing the quality value when the radio signal strength is weak (but making no modification when the received radio signal is strong). Quality values which have been modified by cross-coupling or by RSSI, or both, will hereinafter be referred to as augmented quality values. Decoding only by the use of Boolean algebra, also referred to herein as parity decoding or parity checking, is sometimes referred to as "hard" decoding, whereas when symbol quality value techniques are used (alone or in combination with Boolean algebra techniques), the decoding is sometimes referred to as "soft" decoding. Chase decoding (described in "A Combined Coding and Modulation Approach for Communication over Dispersive Channels", IEEE Transactions on Communications, Vol COM-21, NO.3, Mar. 1973, pp 162–164) is an example of "soft" decoding and BCH decoding is an example of "hard" decoding.

Prior art error correction techniques used for radio signals have been developed using an assumption that burst errors which are induced in the signals are bursts of errors having random length and intervals. Examples of such error correction techniques are convolutional codes and blocked word parity codes. An example of blocked word parity codes is the blocking of 10 code words each of which code word is coded with a (23,12) Golay code, in which bits are transmitted sequentially from each of the 10 code words. The word parity codes are more effective for random errors. The transmission of the words in blocks helps randomize burst error patterns so that the word parity codes can be more effective in correcting the burst errors. A code of this type can achieve a residual bit error rate of $10^{-4}$ when interleaved and 2% of the received data symbols have been destroyed in random burst error patterns. Such codes can be fairly effective for some radio communication systems wherein the length and intervals of burst errors are random or varying, such as in a mobile radio system where the radio moves at varying speeds.

In contrast to the prior art methods discussed above, the interleaving method of the present invention works by causing error patterns characterized by periodic burst errors patterns in the temporal sequence of symbols transmitted in the digital radio signal to occur in certain patterns in the de-interleaved tiered arrangement of symbols which are substantially correctable by the decoding technique of the preferred embodiment of the present invention described herein. These methods can achieve a residual bit error rate of $10^{-4}$ when as much as 20% of the received data is destroyed in periodic burst errors.

Figures 11, 14:
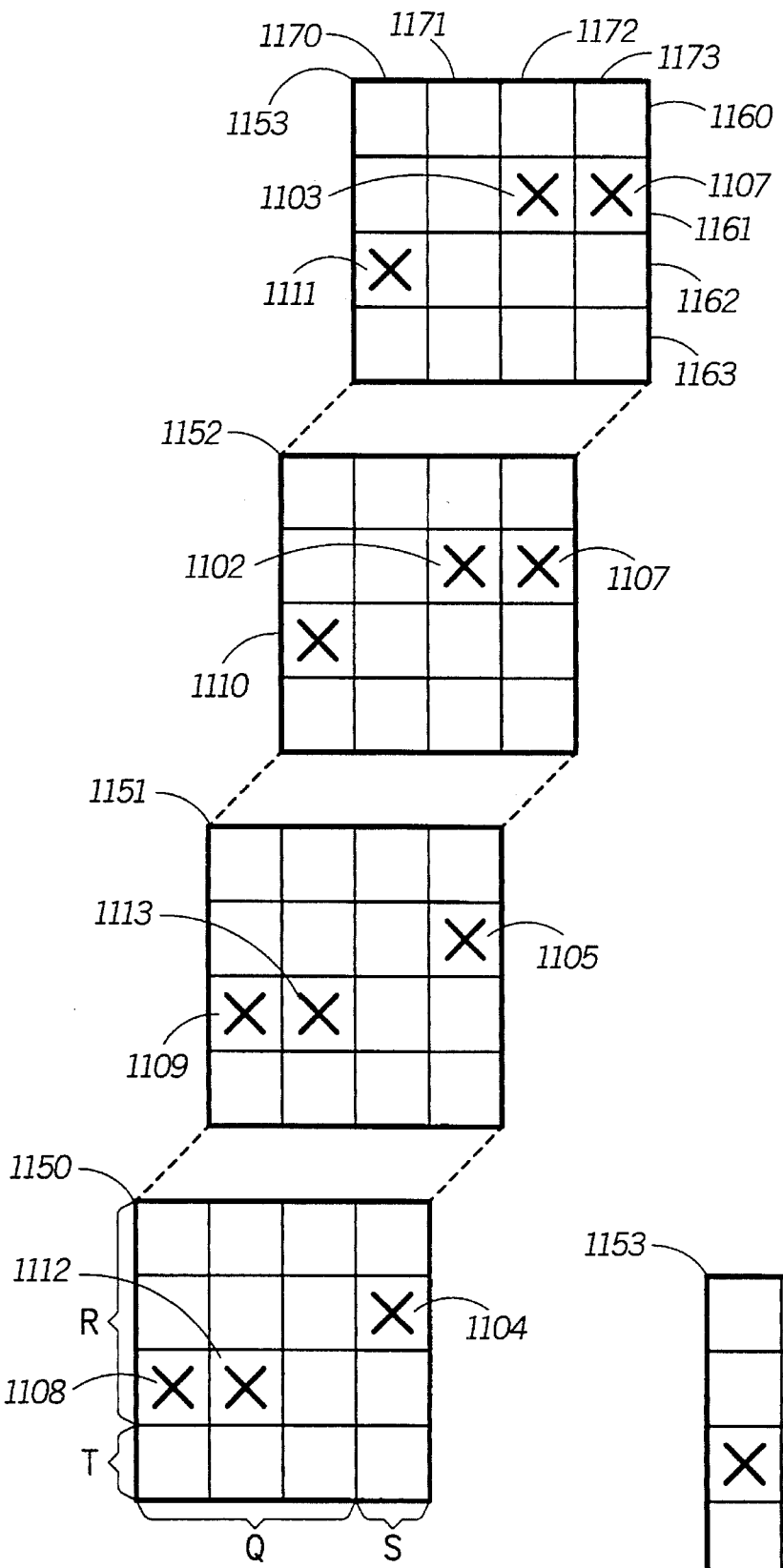
FIG. 11 shows four tiers of data symbols de-interleaved by the portion of the control circuit of FIG. 9, in accordance with a preferred embodiment of the present invention.
FIG. 14 is an illustration of a possible data symbol error pattern causing a particular set of parity results in the control circuit of FIG. 7 and FIG. 8, in accordance with the preferred embodiment of the present invention.

Referring to FIG. 11, four tiers of data symbols de-interleaved by the portion of the control circuit described with reference to FIG. 9 are shown, in accordance with a preferred embodiment of the present invention. Here, R=3, Q=3, T=1, S=1 and N=4. Four tiers of de-interleaved data symbols 1150, 1151, 1152, and 1153 are shown, including an example of 12 sequentially received errors which are illustrated beginning at data symbol 1102 in tier 1152 and continuing through data symbol 1113 in tier 1151. The 12 data symbols affected by the error burst are marked with an "X". Out of 16 symbols in each tier, 3 are corrupted by the error burst in the example. Thus 18.75% of the data has been corrupted by the error burst.

Because there is no more than one error in each column, a simple two-dimensional parity check code can detect all the errors which occur in each code block (code block=tier), although there is an ambiguity regarding the exact location of the errors, which is resolved as described below.

Figure 12:
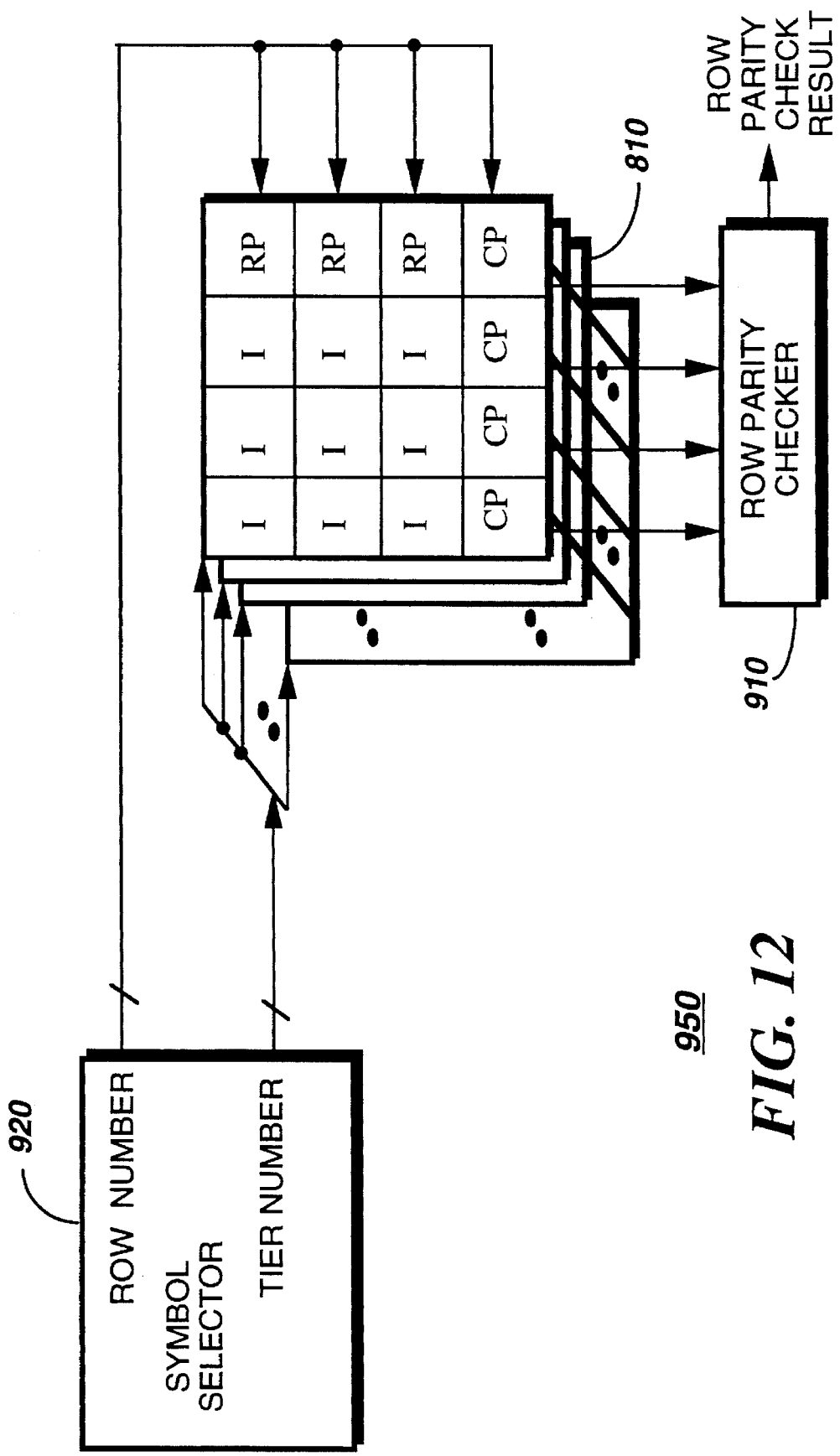
FIG. 12 shows an electrical block diagram of a portion of the control circuit of the selective call receiver of FIG. 7 and FIG. 8, in accordance with the preferred embodiment of the present invention.

Referring to FIG. 12, an electrical block diagram is shown of a portion of the control circuit 206 which performs row parity checking and which is suitable for use in the selective call receiver of FIG. 7 and FIG. 8, in accordance with the preferred embodiment of the present invention. A decoder 950 comprises a row parity checker 910, a symbol selector 920, and the memory 810. The symbol selector 920, coupled to the memory 810 in the control circuit 206, selects a tier and a row number in the selected tier. In this example, the symbol selector selects tier 1153 of FIG. 11, and sequentially selects rows 1160, 1161, 1162, and 1163. As each row is selected, the data symbols in the memory 810 corresponding to the selected tier and row are coupled to the row parity checker 910, which determines whether a parity check of the selected data symbols passes or fails. In this example row 1162 fails, and rows 1160, 1161, and 1163 pass. Row 1161 passes because the two errors offset one another to produce a correct parity check.

Figure 13:
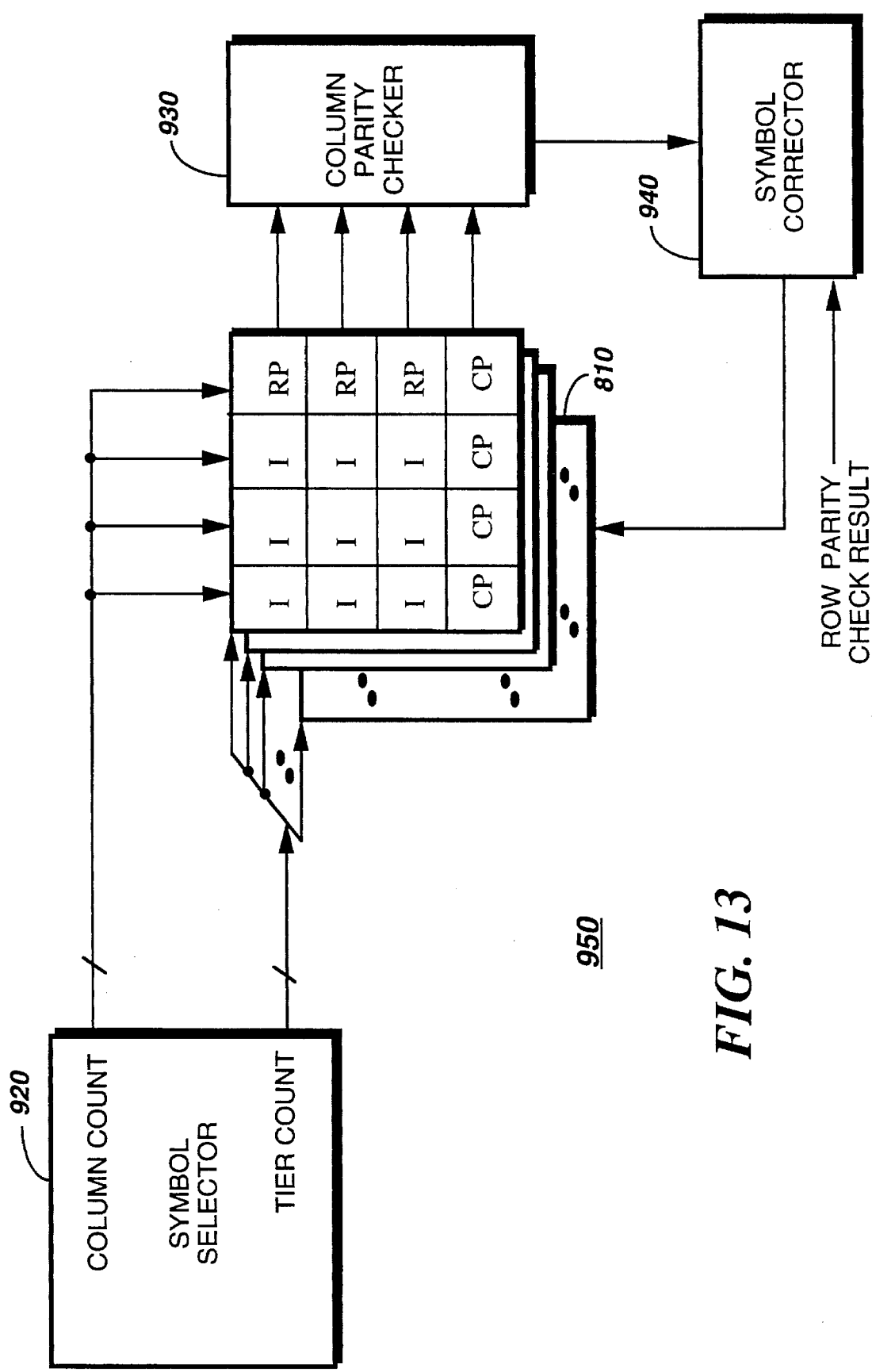
FIG. 13 shows an electrical block diagram of a portion of the control circuit of the selective call receiver of FIG. 7 and FIG. 8, in accordance with the preferred embodiment of the present invention.

Referring to FIG. 13, an electrical block diagram is shown of a portion of the control circuit 206 which performs column parity checking and which is suitable for use in the selective call receiver of FIG. 7 and FIG. 8, in accordance with the preferred embodiment of the present invention. The decoder 950 further comprises a column parity checker 930 and a symbol corrector 940. The symbol selector 920, coupled to the memory 810 in the control circuit 206, selects a tier and a column number in the selected tier. In this example, the symbol selector selects tier 1153 of FIG. 11, and sequentially selects columns 1170, 1171, 1172, and 1173. As each row is selected, the data symbols in the memory 810 corresponding to the selected tier and column are coupled to the column parity checker 930, which determines whether a parity check of the selected data symbols passes or fails. In this example columns 1170, 1172, and 1173 fail, and column 1171 passes. Parity checking results are coupled from the row parity checker 910 (FIG. 12) and the column parity checker 930 (FIG. 13) to the symbol corrector 940 (FIG. 13).

Referring to FIG. 14 an illustration of a data symbol error pattern is
shown, in accordance with the preferred embodiment of the present invention. The data symbol error pattern, shown by X's in FIG. 14., will produce the same row and column parity check results obtained for the example described above. Therefore, there is an ambiguity in the locations of the errors. The parity checking results alone cannot always determine which of the data symbols need to be corrected. The symbol corrector 940 identifies errors determined by the row parity checker 910 (FIG. 12) and column parity checker (FIG. 13) as ambiguous errors or non-ambiguous errors. Non-ambiguous errors, for which multiple parity check results do not exist, are corrected when they are identified.

The ambiguous errors are resolved in two ways. The symbol corrector 940 (FIG. 13) uses a quality value decoding technique in which the symbol corrector 940 evaluates a tier of data symbols to correct those which have ambiguous errors. The symbol corrector 940 identifies all data symbols having ambiguous errors by using parity equations (as described with reference to FIG. 14), and selects data symbols for correction from the identified symbols by selecting and changing the values of increasing numbers of data symbols having the lowest (worst) augmented quality values associated therewith, until no parity errors are identified by the row parity checker 910 (FIG. 12) and the column parity checker (FIG. 13). This use of the augmented quality value is an improvement over "soft" decoding techniques known to one of ordinary skill in the art. This unique combination of the tiered encoding and decoding techniques and the quality value decoding technique using augmented quality values results in substantial error rate reduction compared to prior art techniques.

The symbol corrector 940 (FIG. 13) also uses a burst assumption technique when ambiguous errors remain, in which row and column parity equations are used to identify all possible remaining data symbols having ambiguous errors, and the ambiguous errors are removed by selecting a set of the possible data symbols which are related best by having been sequentially transmitted (i.e., the best burst pattern is selected), upon an assumption that burst errors are probable. This error correction technique results in further improvement of the error rate. It will be appreciated that these two techniques can be combined in various ways. In this example, when an ambiguity still exists after using the quality value technique, the burst assumption technique can be used in many instances to resolve the ambiguity, but the burst assumption could alternatively be used first. It will be further appreciated that the number of data symbols in each symbol set 730 of FIG. 4 must have a particular relationship to the repetition rate of error bursts to obtain the improved error correction described above for the preferred embodiment of the present invention. Referring again to FIG. 11, it is clear that a burst of errors which occurs periodically only once in each set of $N \times (Q+S) \times (R+T)$ symbols and which is less than N symbols in length will produce an error pattern having no more than one error in each row and each column and that longer bursts of errors are distributed amongst the tiers, thereby minimizing multiple errors occuring in a single row or column of one tier. Therefore, optimum performance of the interleaving method of the present invention occurs when the relation of symbol rate and burst error rate is such that one whole set of $N \times (Q+S) \times (R+T)$ symbols is transmitted in the period of one error burst. Thus, $$P = [N \times (Q+S) \times (R+T)]/SPS,$$

where P is the period in seconds of the periodic error burst, and SPS is the total number of symbols (information plus parity symbols) transmitted per second. The period P can also be expressed as $P = (A \times N)/SPS$, wherein:

$$A = (Q+S) \times (R+T).$$

For simulcast systems, the transmitter difference frequency should be substantially equal to 1/P to yield the desired repetition rate of error bursts.

In addition to the optimum burst error repetition rate, P, a number of other repetition rates fall in frequency ranges which will result in error patterns which are substantially fully correctable. These other rates depend on the values of Q, S, R, T, and N as well as on the details of the decoding algorithm used.

Figure 15:
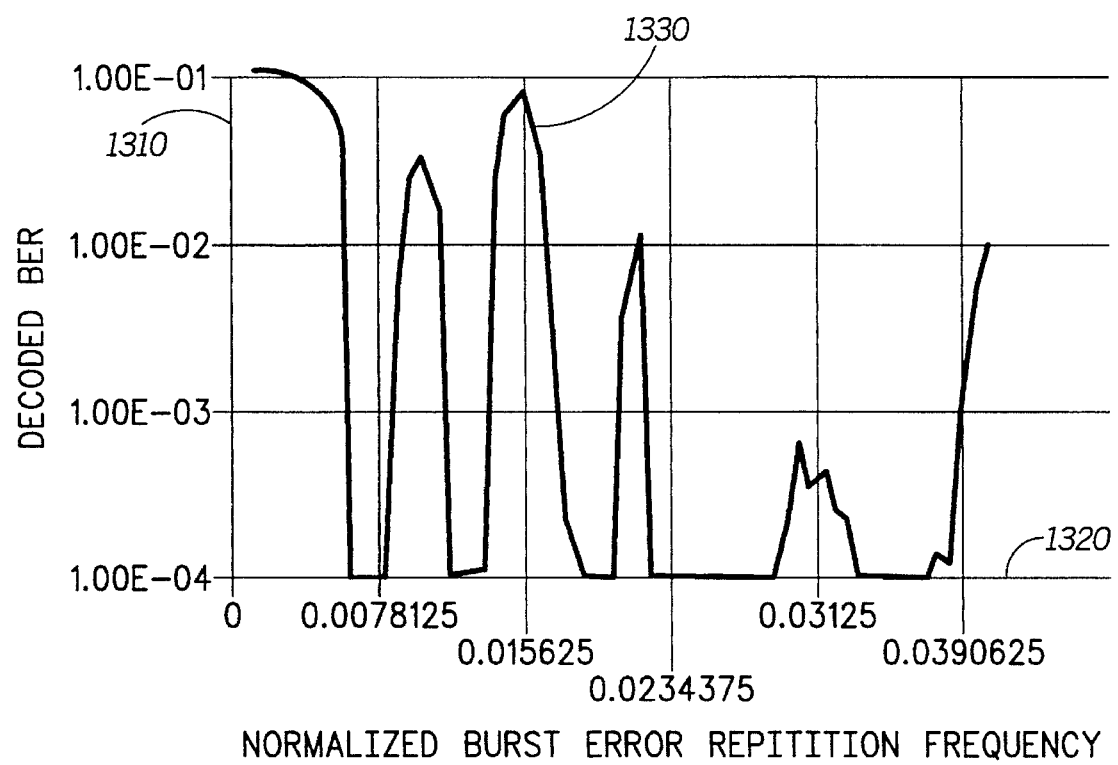
FIG. 15 shows a graph of computer simulation results for an example of a set of data symbols, in accordance with the preferred embodiment of the present invention.

Referring to FIG. 15, a graph of computer simulation results is shown for the example where R=Q=3, T=S=1, and N=8, in accordance with the preferred embodiment of the present invention. The axis 1320 labeled "Normalized Burst Error Repetition Frequency" has a scale for a burst error repetition frequency (Hz) divided by the data symbol rate (symbols/sec). The axis 1310 labeled "Decoded BER" (Decoded Bit Error Rate) has a scale for a residual error rate remaining after decoding with a parity and data symbol quality value algorithm similar to the one described above, and known to one of ordinary skill in the art, showing the dramatic improvements possible with the use of the interleaving/de-interleaving techniques described above. In the computer simulation, 22.5% of the transmitted data was destroyed in simulated periodic error bursts, with the bursts simulated at large number of different normalized burst error repetition frequencies values ranging from near 0 to approximately 0.04, and plotted as curve 1330 in FIG. 15.

As described above, the optimum burst error repetition period for the example used above is P=[N×(Q+S)×(R+T)]/SPS=128/SPS seconds, corresponding to a burst error repetition frequency of SPS/128 and a normalized burst error repetition frequency of SPS/128/SPS=1/128=0.0078125. A first null of curve 1330 in FIG. 15 shows that the residual bit error rate after decoding is less than $10^{-4}$ at the normalized frequency of 0.0078125, and across a range of normalized frequencies and at normalized frequencies substantially equivalent to 0.0078125. There are several additional nulls shown in FIG. 15 where the residual bit error rate after decoding is less that $10^{-4}$, each null spanning a range of normalized frequencies. For a data symbol rate of 4800 symbols per second, the burst error repetition frequency would be 4800×0.0078125=37.5 Hz. The range of normalized frequencies substantially equivalent to the normalized frequency of 0.0078125 correspond to a range of burst error rates substantially equivalent to 37.5 Hz. Thus, when two simulcast transmitters 103 (FIG. 1) are controlled to have a difference substantially equal to of 37.5 Hz, and the example symbol set is used in a system using a 4800 data symbols per second digital code, burst error rates of 22.5% are largely correctable. This is in contrast to the performance of prior art coding schemes quoted above, which have an ability to achieve a $10^{-4}$ error rate with no more than 2% of burst symbol errors—a factor of 10 times improvement for the present invention. As shown in this example, the data symbol rate and coding scheme provide a first frequency range including the frequency determined by the data symbol rate and N×(Q+S)×(R+T), and other higher frequency ranges, at which burst errors are largely correctable. The unique addition of the quality value cross coupling technique and the use of the received signal strength indication to further modify the quality value provide further improvements.

It will be appreciated that the present invention is also usable in any communication system, not just radio systems, and will provide significant improvements in any system characterized by error patterns having a bursty, periodic nature. In some systems, the use of the signal strength indication may not provide a portion of the improvement, but the other aspects (tiered encoding/decoding, cross coupling of quality values, and the burst assumption techniques) will provide improved decoding.

Figure 16:
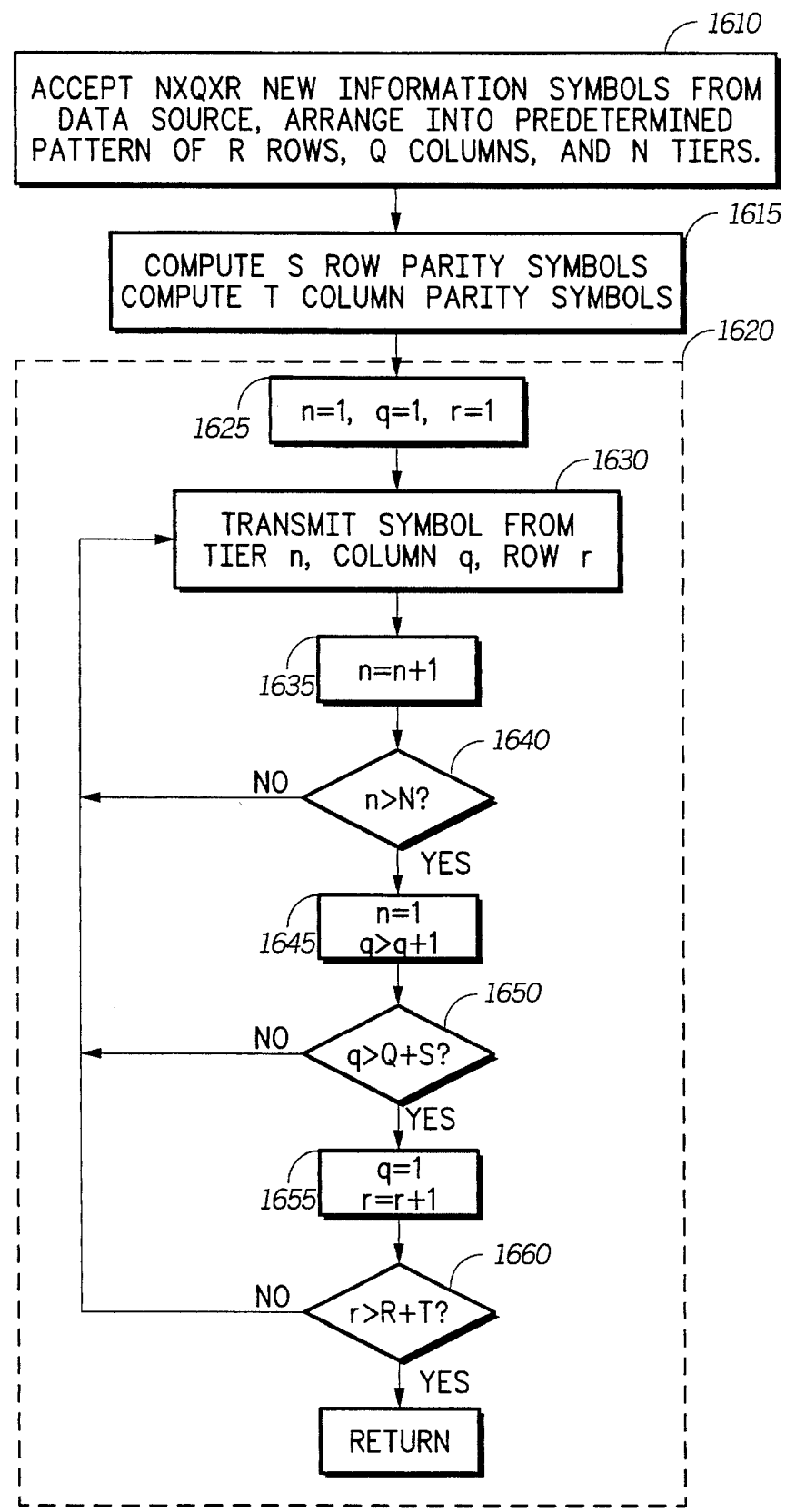
FIG. 16 shows a flow chart which illustrates a method of encoding used in the system controller of FIG. 3, in accordance with the preferred embodiment of the present invention.

Referring to FIG. 16, a flow chart is shown which illustrates a method used in the system controller 102 for encoding the tier 730 of the digital radio signal, in accordance with the preferred embodiment of the present invention. At step 1610, the encoder accepts N×Q×R new information symbols from the message handler 404 (FIG. 3) and stores them in memory 423 (FIG. 3). The information symbols are stored in memory 423 in an arbitrary, but predetermined pattern of R rows by Q columns by N tiers. At step 1615, the S row parity symbols for each row and the T column parity symbols for each column are computed. The S row parity symbols for each row are stored in memory 423 in columns Q+1 through Q+S as illustrated in FIG. 5. The T column parity symbols for each column are stored in memory 423 in rows R+1 through R+T as illustrated in FIG. 5. An interleaving portion of the method 1620 includes steps 1625 through 1660. At step 1625, variables n, q and r are initialized to values of 1. The symbol stored in memory at tier n, column q, row r is transmitted at step 1630. Variable n is incremented by one at step 1635 and tested at step 1640 to determine when all tiers have been used. When all tiers have not been transmitted, the method is continued at step 1630, using the current values of n, q and r. When all tiers have been transmitted, n is reset to one and q is incremented by one at step 1645. Variable q is tested at step 1650 to determine when all columns have been transmitted. When all columns have not been transmitted, the method is continued at step 1630, using the current values of n, q and r. When all columns have been transmitted, q is reset to one and r is incremented by one at step 1655. Variable r is tested at step 1660 to determine when all rows have been transmitted. When all rows have not been transmitted, step 1630 is repeated using the current values of n, q and r. When all rows have been transmitted, the encoding method of the symbol set 730 is complete.

Figure 17:
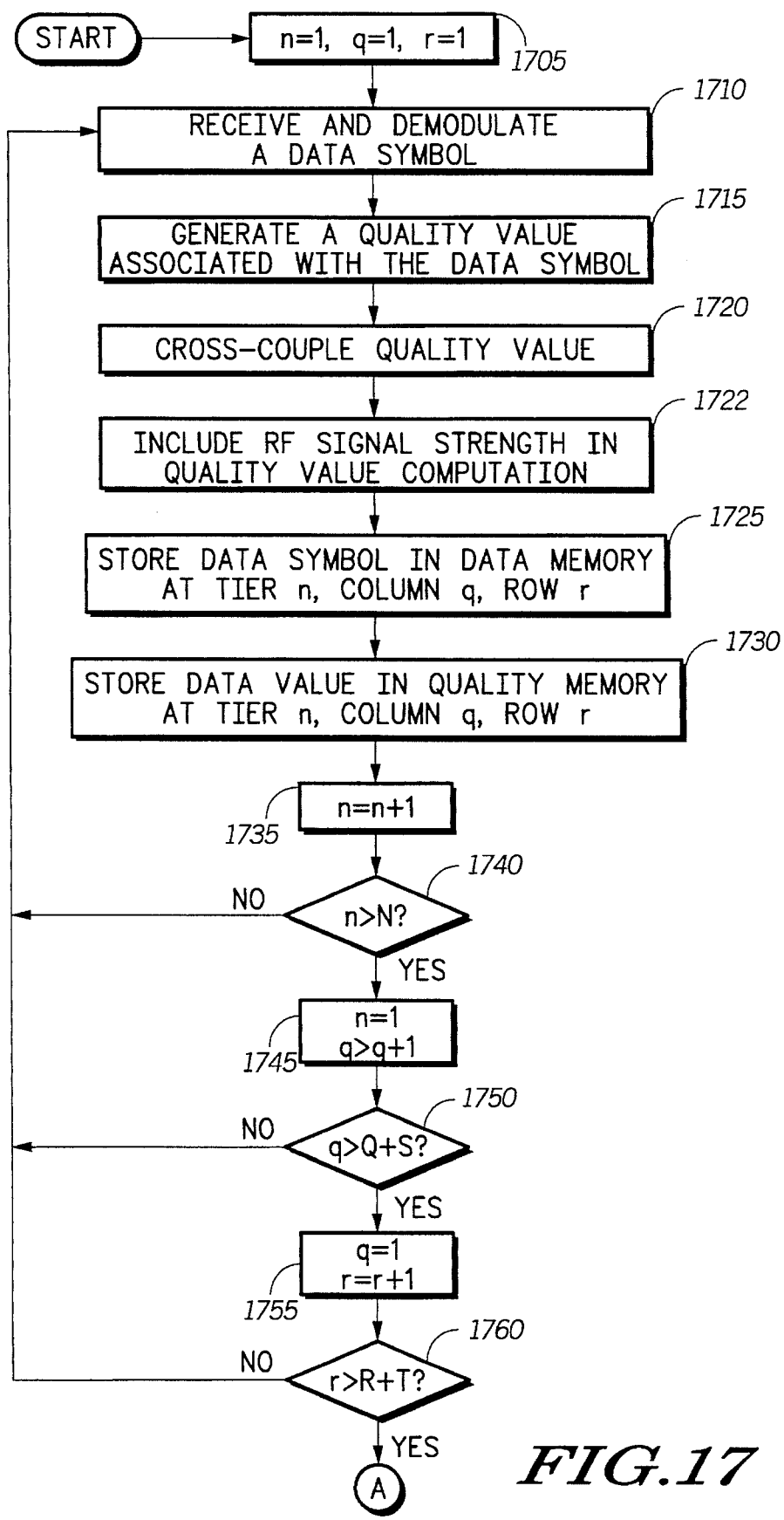
FIG. 17 shows a flow chart which illustrates a method of decoding used in the control circuit of FIG. 9, in accordance with the preferred embodiment of the present invention.

Referring to FIG. 17, a flow chart is shown which illustrates a method used in the control circuit 206 of FIG. 9 for decoding a tier 730 of the digital radio signal,, in accordance with the preferred embodiment of the present invention. At step 1705, variables n, q and r are initialized to values of one. At step 1710, a data symbol is received from threshold symbol detector 840. At step 1715, a quality value is received from symbol quality detector 850. The quality value received at step 1715 corresponds with the symbol received at step 1710. At step 1720 the quality value is cross-coupled with one or several quality values which are computed for symbols adjacent in time or signal space. At step 1722, the quality value may be further refined by including received signal strength information in the computation of the final quality value. At step 1725, the data symbol received at step 1710 is stored in the data memory portion of memory 810 at tier n, column q, row r. At step 1730, the cross-coupled quality value, computed at step 1720, is stored in the quality memory portion of memory 810 at tier n, column q, row r. The portion of the method described at steps 1735 through 1760 include the counting and logic functions which de-interleave the received data and corresponding quality values. Variable n is incremented by one at step 1735 and tested at step 1740 to determine when all tiers have been transmitted. When all tiers have not been transmitted, the method is continued at step 1710, using the current values of n, q and r. When all tiers have been transmitted, n is reset to one and q is incremented by one at step 1745. Variable q is tested at step 1750 to determine when all columns have been transmitted. When not all columns have been transmitted, the method is continued at step 1710, using the current values of n, q and r. When all columns have been transmitted, q is reset to one and r is incremented by one at step 1755. Variable r is tested at step 1760 to determine is all rows have been transmitted. When not all rows have been transmitted, the method is continued at step 1710, using the current values of n, q and r. When all rows have been transmitted, the process continues with steps which decode errors, as described below.

Figure 18:
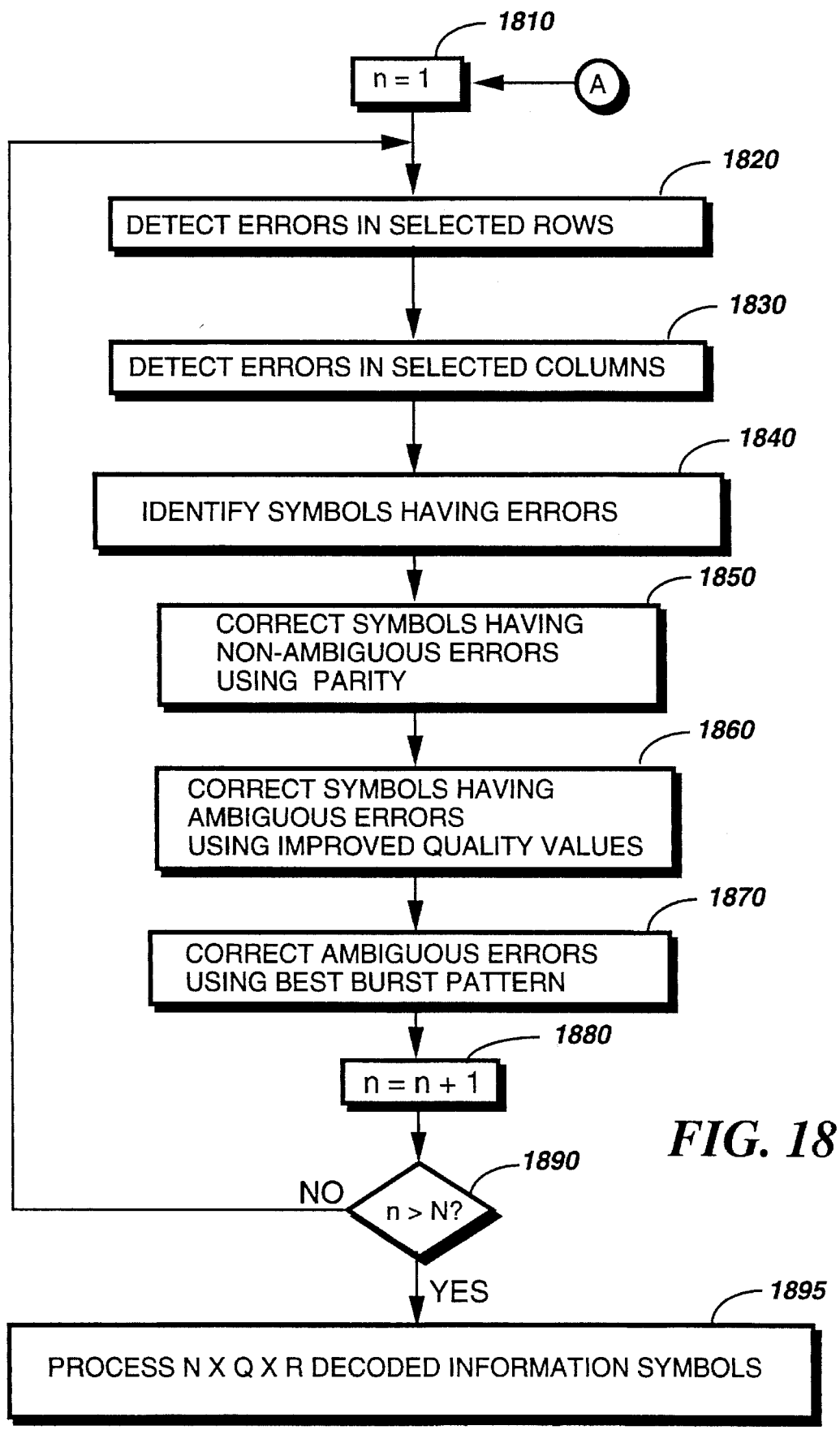
FIG. 18 shows a flow chart which illustrates a method of forward error correction used in the control circuit of FIG. 9, in accordance with the preferred embodiment of the present invention.

Referring to FIG. 18, a flow chart is shown which illustrates a method of forward error correction in accordance with the preferred embodiment of the present invention. At step 1810, variable n is initialized to one. At step 1820, the Q+S symbols in each of the R +T rows are checked for parity errors. At step 1830, the R+T symbols in each of the Q+S columns is checked for parity errors. The symbol corrector 940 (FIG. 13) at step 1840 determines all possible error patterns which satisfy the row and column parity checking results, and further identifies which of the possible errors are non-ambiguous (that is, each possible symbol correction which is an only correction which corrects one or more parity checks). The remaining possible errors are identified as ambiguous errors. At step 1850, non-ambiguous errors found by the parity checking in both rows and columns are corrected by the symbol corrector 940 (FIG. 13). At step 1860, ambiguous errors are corrected by the symbol corrector 940 (FIG, 13), based on the augmented quality values for the ambiguous errors, in a manner described above. Burst patterns are determined for any remaining ambiguous errors, at step 1870, and symbols are selected for correction which have the best burst patterns and correct all parity checks. Burst patterns are determined by temporal proximity in the received signal of the symbols having possible errors. Variable n is incremented by one at step 1880 and tested at step 1890 to determine when all tiers have been transmitted. When not all tiers have been encoded, the method is continued at step 1820, using the current value of n. When all tiers of the symbol set 730 have been encoded, the N×Q×R decoded information symbols are further processed at step 1895 by the control circuit 206 (FIG. 9) using the same predetermined pattern as used for encoding at step 1610 of FIG. 16. For example, additional symbol sets 730 of the digital radio signal may be decoded, or some of the information symbols may be presented on the display 211 or 317 of the selective call receiver.

In operation of the flow chart of FIG. 17, it will be appreciated that the method described in FIG. 17 is preceded by steps (not shown in FIG. 17), well known to one of ordinary skill in the art, for synchronizing the reception of the data symbols to the transmitted data symbols, which ensure that each received block of N×(R+T)×(Q+S) data symbols is de-interleaved and decoded at the receiver in exact correspondence to the block of N×(R+T)×(Q+S) data symbols encoded and interleaved at the transmitter.

It will be appreciated that the encoding method and apparatus described above for use in the system controller 102 can alternatively be used in selective call receivers having transmitters, and the decoding method and apparatus described above for use in the selective call receivers can alternatively be used in system controller 102. This would be appropriate, for instance, where the same encoding methods are desired in both directions in a radio communication system for compatibility and commonality of design, or perhaps where a low level periodic interference exists at the transmitter/receivers 103 which cannot be eliminated by other means. By now it should be appreciated that there has been provided a method and an apparatus for encoding and decoding a digital signal in tiers which provides substantial improvement in situations where burst errors are induced in the digital radio signal during the transmission of the digital radio signal at predeterminable periods, such as in a simulcast system wherein digital radio signals of nearly equal strength are present within overlapping cell boundaries. The method and apparatus include the use of an augmented quality value decoding technique and a burst assumption technique, which provide performance better than that achievable by using the tier encoding with prior art quality value decoding techniques, which has been shown to achieve up to ten times improvement over non-tiered techniques.

I claim:

1. A method for use in a system controller of a selective call radio communication system for encoding information in a digital radio signal having N×Q×R information symbols, wherein Q, R, and N are positive integers, comprising the steps of:

arranging the N×Q×R information symbols into N tiers of Q×R information symbols, wherein each tier of Q×R information symbols includes R rows having Q information symbols in each row, and includes Q columns having R information symbols in each column;

determining S row parity symbols for addition to each of the R rows as a function of the Q information symbols in the row, wherein S is a positive integer;

expanding each tier to Q+S columns by adding to each row the S row parity symbols determined for each row, at a position which is the same in each row;

determining T column parity symbols for addition to each of the Q+S columns as a function of the R symbols in each column, wherein T is a positive integer;

expanding each tier to R+T rows by adding to each column the T column parity symbols determined for each column; and transmitting the N×(Q+S)×(R+T) symbols in an interleaved sequence, said step of transmitting comprising the steps of:

selecting one of (Q+S) columns and one of (R+T) rows;

transmitting N symbols selected sequentially from the selected one of (Q+S) columns and the selected one of (R+T) rows in each of the N tiers;

selecting sequentially each of the remaining (Q+S–1) columns and repeating for each sequentially selected column said transmitting step; and selecting sequentially each of the remaining (R+T–1) rows and repeating for each sequentially selected row said steps of transmitting N symbols and selecting sequentially each of the remaining (Q+S–1) columns, wherein the digital signal is transmitted simultaneously from two transmitters having a difference frequency 1/P, and wherein the symbols are transmitted at a transmission rate of SPS symbols per second and wherein the period of the difference frequency is related to N, Q, S, R, T, and SPS.

2. The method for use in a system controller according to claim 1, wherein the period of the difference frequency P is substantially equal to (N×(Q+S)×(R+T))/SPS.

3. A system controller for use in a selective call radio communication system, wherein the system controller encodes information in a digital radio signal having N×Q×R information symbols, wherein Q, R, and N are positive integers, comprising:

an information memory for arranging the N×Q×R information symbols into N tiers of Q×R information symbols, wherein each tier of Q×R information symbols includes R rows having Q information symbols in each row, and includes Q columns having R information symbols in each column;

a parity generator, coupled to said information memory, for determining parity symbols from the information symbols, and generating a total quantity of N×(R+T)×(Q+S) symbols for transmission in the digital radio signal, wherein said parity generator comprises:

a row parity encoder, coupled to said information memory, for determining S row parity symbols for addition to each of the R rows as a function of the Q information symbols in each row, wherein S is a positive integer;

a row parity memory, coupled to said row parity encoder, for expanding each of the N tiers to Q+S columns by adding to each row of each tier the S row parity symbols determined for each row, at a predetermined location which is the same in each row;

a column parity encoder, coupled to said information and row parity memories, for determining T column parity symbols for addition to each of the Q+S columns as a function of the R symbols in each column, wherein T is a positive integer; and a column parity memory, coupled to said column parity encoder, for expanding each tier to R+T rows by adding to each column the T column parity symbols determined for each column;

an address circuit, coupled to said encoder, for sequentially selecting each of the N×(R+T)×(Q+S) symbols, which is in one of (Q+S) columns, one of (R+T) rows, and one of N tiers, by sequentially selecting the (R+T) columns after sequentially selecting the (Q+S) rows after sequentially selecting the N tiers; and a communication interface, coupled to said address circuit, for transmitting the sequentially selected symbols at a transmission rate of SPS symbol per second, and wherein SPS, Q, R, S, T, and U are related to a difference frequency of two transmitters of the radio communication system.

4. The system controller according to claim 3, wherein the difference frequency has a period P substantially equal to (N×(Q+S)×(R+T))/SPS.

5. A selective call radio communication system, which encodes information in a digital radio signal having N×Q×R information symbols, wherein the symbols are transmitted at a symbol transmission rate of SPS symbols per second, wherein Q, R, and N are positive integers, and wherein the system comprises:

a system controller for generating the digital radio signal, comprising:

an information memory for arranging the N×Q×R information symbols into N tiers of Q×R information symbols, wherein each tier of Q×R information symbols includes R rows having Q information symbols in each row, and includes Q columns having R information symbols in each column;

a parity generator, coupled to said information memory, for determining parity symbols from the information symbols, and generating a total quantity of N×(R+T)×(Q+S) symbols for transmission in the digital radio signal;

an address circuit, coupled to said encoder, for sequentially selecting each of the N×(R+T)×(Q+S) symbols, which is in one of (Q+S) columns, one of (R+T) rows, and one of N tiers, by sequentially selecting the (R+T) columns after sequentially selecting the (Q+S) rows after sequentially selecting the N tiers; and a communication interface, coupled to said address circuit, for transmitting the sequentially selected symbols; and two or more transmitters having a difference frequency 1/P, coupled to said communications interface, which simulcast transmit the digital radio signal, and wherein the values of Q, R, S, T and N are selected as a function of the difference frequency and the symbol transmission rate, SPS.

6. The selective call radio communication system according to claim 5, wherein the difference frequency has a period P substantially equal to (N×(Q+S)×(R+T))/SPS.

7. A selective call receiver for use in a selective call communication system, wherein information is communicated using a digital signal, and wherein said selective call receiver comprises:

a receiver for receiving and demodulating the digital signal which includes a predetermined sequence of A×N interleaved symbols representing a non-interleaved set of N tiers of symbols, each tier having A symbols, wherein A and N are positive integers; and a controller, coupled to the receiver, for deinterleaving and decoding the digital signal, comprising;

a deinterleaver, coupled to said receiver, for reconstructing the non-interleaved set of N tiers of symbols from the demodulated signal, said deinterleaver comprising a memory, coupled to said receiver, for storing N tiers of A symbols; and a decoder, coupled to said deinterleaver, for detecting and correcting errors in the deinterleaved set of N tiers of symbols stored in said memory, wherein said decoder comprises:

a symbol corrector, coupled to said memory, for identifying ambiguous and non-ambiguous errors in each tier of symbols by using parity equations, and for correcting symbols having non-ambiguous errors by using parity equations, wherein said symbol corrector also corrects ambiguous errors by selecting from the set of symbols having ambiguous errors a selected set of symbols having a better burst pattern than burst patterns of other sets of symbols selectable from the set of symbols having ambiguous errors.

8. The selective call receiver according to claim 7, wherein the symbols are transmitted at a symbol transmission rate of SPS symbols per second, and wherein, when the digital signal is simulcast transmitted by two or more transmitters, said two or more transmitters have a difference frequency of 1/P, and wherein the period of the difference frequency is related to the symbol transmission rate and the N tiers of symbols by P=(N×A)/SPS.

9. The selective call receiver according to claim 7, wherein each tier of symbols has (R+T) rows and (Q+S) columns of symbols, wherein each row includes T row parity symbols and R row information symbols, and each column includes S column parity symbols and Q column information symbols, wherein each tier has (R+T) rows and (Q+S) columns, wherein each row includes (Q+S) symbols, wherein each column includes (R+T) symbols, wherein A=(R+T)×(Q+S), wherein Q, R, S, and T are positive integers, and wherein the decoder further comprises:

a symbol selector, coupled to said memory, for selecting in sequence the rows and columns of the at least one tier of symbols;

a row parity checker, coupled to said symbol selector and said memory, for detecting errors using the T row parity and R row information symbols stored in said memory which are associated with each selected row of symbols;

a column parity checker, coupled to said symbol selector and said memory, for detecting errors using the S column parity and Q column information symbols stored in said memory which are associated with each selected column of symbols; and a symbol corrector, coupled to said row and column parity checkers and to said memory, for identifying ambiguous and non-ambiguous errors and for correcting symbols having non-ambiguous errors.

10. The selective call receiver according to claim 7, wherein said controller further comprises a symbol quality detector, coupled to said receiver, which generates a quality value corresponding to the quality of each of the A×N received symbols, wherein the deinterleaver further comprises a quality memory, coupled to said symbol quality detector, which stores the A×N quality values corresponding to each received symbol, and wherein said symbol corrector, further coupled to said quality memory, corrects ambiguous errors by selecting symbols based on the quality values and correcting symbols having ambiguous errors such that no errors are detected when errors are rechecked by said symbol corrector using parity equations.

11. The selective call receiver according to claim 7, wherein said controller further comprises a symbol quality detector, coupled to said receiver, which generates a quality value for each of the A×N symbols inversely related to the amount of difference between a demodulated voltage of the symbol and one voltage of a predetermined set of nominal received voltages which is closest to the demodulated voltage, wherein said deinterleaver further comprises a quality memory, coupled to said symbol quality detector, which stores the A×N quality values corresponding to each received symbol, and wherein the symbol corrector, further coupled to said quality memory, corrects ambiguous errors by selecting symbols having low quality values and correcting symbols having ambiguous errors such that no errors are detected when errors are re-checked by said symbol corrector using parity equations.

12. The selective call receiver according to claim 7, wherein said controller further comprises a symbol quality detector, coupled to said receiver, which generates a quality value for each of the A×N symbols inversely related to the amount of difference between a demodulated voltage of the symbol and one voltage of a predetermined set of nominal received voltages which is closest to the demodulated voltage, and further generates an augmented quality value by cross coupling the quality value for the symbol to the quality values for other symbols which are in temporal proximity, within the digital radio signal, to the symbol, wherein said deinterleaver further comprises a quality memory, coupled to said symbol quality detector, which stores the A×N quality values corresponding to each received symbol, and wherein said symbol corrector, further coupled to said quality memory, corrects ambiguous errors by selecting symbols having low augmented quality values and correcting symbols having ambiguous errors such that no errors are detected when errors are re-checked by said symbol corrector using parity equations.

13. The selective call receiver according to claim 9, wherein said controller further comprises a symbol quality detector, coupled to said receiver, which generates a quality value for each of the A×N symbols inversely related to the amount of difference between a demodulated voltage of the symbol and one voltage of a predetermined set of nominal received voltages which is closest to the demodulated voltage, and further modifies the quality value based on the signal strength of the digital radio signal during the receipt of the symbol, wherein said deinterleaver further comprises a quality memory, coupled to said symbol quality detector, which stores the A×N quality values corresponding to each received symbol, and wherein said symbol corrector, further coupled to said quality memory, corrects ambiguous errors by selecting symbols having low augmented quality values and correcting a sufficient number of symbols having ambiguous errors such that no errors are detected when errors are re-checked by said symbol corrector using parity equations.

14. A method for use in a selective call receiver for recovering information from a digital radio signal having a predetermined temporal sequence of A×N symbols representing a non-interleaved set of N tiers of symbols, each tier having A symbols arranged and in rows and columns, wherein A and N are positive integers, and any set of N temporally adjacent symbols in the predetermined temporal sequence of A×N symbols consists of symbols of different tiers, wherein the method comprises the steps of:

receiving and demodulating the digital radio signal, to generate the predetermined temporal sequence of symbols;

identifying the tier, row, and column in which each symbol is included;

storing A symbols of one of the N tiers into a memory, wherein each stored symbol is associated with the tier, row, and column identified therewith; and decoding errors in the one tier of the N tiers, and wherein each of said steps of deinterleaving, storing, and selecting and decoding are performed for the N tiers of symbols, and wherein said step of decoding comprises the steps of:
identifying ambiguous and non-ambiguous errors in each tier of A symbols by using parity equations;
correcting symbols having non-ambiguous errors by using parity equations; and
correcting ambiguous errors by selecting from the set of symbols having ambiguous errors a selected set of symbols having a better burst pattern than burst patterns of other sets of symbols selectable from the set of symbols having ambiguous errors.

15. The method for recovering digital information from a digital radio signal in a selective call receiver according to claim 14, wherein the symbols are transmitted at a symbol transmission rate of SPS symbols per second, and wherein, when the digital signal is simulcast transmitted by two or more transmitters, said two or more transmitters have a difference frequency of 1/P, and wherein the period of the difference frequency is related to the symbol transmission rate and the N tiers of symbols by $P=(N \times A)/SPS$.

16. The method for recovering digital information from a digital radio signal in a selective call receiver according to claim 14, wherein each tier of symbols has (R+T) rows and (Q+S) columns of symbols, wherein each row includes T row parity symbols and R row information symbols, and each column includes S column parity symbols and Q column information symbols, wherein $A=(R+T) \times (Q+S)$, wherein Q, R, S, and T are positive integers, and wherein said step of identifying ambiguous and non-ambiguous errors further comprises the steps of:

selecting in sequence the rows of the at least one tier of symbols and detecting all possible row errors in each row using the T row parity and R row information symbols stored in said memory which are associated with the row associated with the selected symbol;

selecting in sequence the columns of the at least one tier of symbols and detecting all possible column errors using the S column parity and Q column information symbols stored in said memory which are associated with the column associated with the selected symbol; and identifying symbols having ambiguous and non-ambiguous errors in the rows and columns of each tier.

17. The method for recovering digital information from a digital radio signal in a selective call receiver according to claim 14, wherein the step of decoding further comprises the steps of:

generating a quality value for each of the A symbols in each of the N tiers of the digital radio signal;

storing in a quality memory the A×N generated quality values; and correcting ambiguous errors by selecting symbols based on the quality values and correcting symbols having ambiguous errors such that no errors are detected when said steps of selecting and detecting row and column errors are repeated.

18. The method for recovering digital information from a digital radio signal in a selective call receiver according to claim 17 wherein said step of generating a quality value further comprises the step of:

generating a quality value related to the amount of difference between a demodulated voltage of the symbol and one voltage of a predetermined set of nominal received voltages which is closest to the demodulated voltage, wherein worse intermediate quality values are associated with larger differences, and wherein in said step of correcting ambiguous errors by selecting symbols based on the quality values and correcting symbols having ambiguous errors, the selected symbols have worse quality values than the quality values of non-selected symbols.

19. The method for recovering digital information from a digital radio signal in a selective call receiver according to claim 17 wherein said step of decoding further comprises the steps of:

generating one of A×N quality values for each of the A×N symbols in the N tiers of the digital radio signal, wherein each quality value is related to the amount of difference between a demodulated voltage of the symbol and one voltage of a predetermined set of nominal received voltages which is closest to the demodulated voltage, and wherein worse quality values are associated with larger differences; and generating an augmented quality value for each symbol by cross-coupling to the quality values for other symbols which are in temporal proximity, within the digital radio signal, to the symbol;

storing in a quality memory the A×N generated augmented quality values; and wherein in said step of correcting ambiguous errors by selecting symbols based on the quality values and correcting symbols having ambiguous errors, the selected symbols have worse augmented quality values than the augmented quality values of non-selected symbols.

20. The method for recovering digital information from a digital radio signal in a selective call receiver according to claim 17, wherein said step of generating the quality value for a symbol further comprises a step of:

modifying the quality value based on the on the signal strength of the digital radio signal during the receipt of the symbol.

* * * * *

UNITED STATES PATENT AND TRADEMARK OFFICE
CERTIFICATE OF CORRECTION

PATENT NO. : 5,559,506
DATED : September 24, 1996
INVENTOR(S) : Leitch, Clifford D.

It is certified that error appears in the above-indentified patent and that said Letters Patent is hereby corrected as shown below:

column 3, line 37, replace "U" with --N--.

In claim 3, column 21, line 19, replace "U" with --N--.

In claim 20, column 26, line 29, delete the second occurrence of "on the".

Signed and Sealed this

Eighth Day of September, 1998

Attest:

BRUCE LEHMAN

Attesting Officer

Commissioner of Patents and Trademarks